US011452240B2

(12) United States Patent
Okabe

(10) Patent No.: US 11,452,240 B2
(45) Date of Patent: Sep. 20, 2022

(54) POWER TRANSFER APPARATUS, POWER TRANSMISSION APPARATUS, POWER RECEPTION APPARATUS, AND POWER TRANSFER SYSTEM

(71) Applicant: DAI NIPPON PRINTING CO., LTD., Tokyo (JP)

(72) Inventor: Masato Okabe, Tokyo (JP)

(73) Assignee: DAI NIPPON PRINTING CO., LTD, Tokyo (JP)

( * ) Notice: Subject to any disclaimer, the term of this patent is extended or adjusted under 35 U.S.C. 154(b) by 0 days.

(21) Appl. No.: 17/271,846

(22) PCT Filed: Aug. 30, 2019

(86) PCT No.: PCT/JP2019/034251
§ 371 (c)(1),
(2) Date: Apr. 8, 2021

(87) PCT Pub. No.: WO2020/045661
PCT Pub. Date: Mar. 5, 2020

(65) Prior Publication Data
US 2021/0321529 A1    Oct. 14, 2021

(30) Foreign Application Priority Data

Aug. 30, 2018    (JP) .............................. JP2018-161930

(51) Int. Cl.
*H05K 7/20* (2006.01)
*H02J 50/10* (2016.01)

(52) U.S. Cl.
CPC ............ *H05K 7/2039* (2013.01); *H02J 50/10* (2016.02)

(58) Field of Classification Search
CPC ......... H05K 7/2039; H05K 7/20; H02J 50/10; H02J 50/70; Y02T 10/70; Y02T 10/7072;
(Continued)

(56) References Cited

U.S. PATENT DOCUMENTS 7,952,322 B2 *    5/2011    Partovi ................... H01F 38/14
320/108
9,438,071 B1 *    9/2016    Helberg .................. H02J 50/70
(Continued)

FOREIGN PATENT DOCUMENTS

JP    2006-129605 A    5/2006
JP    2006129605 A *   5/2006
(Continued)

OTHER PUBLICATIONS

Oct. 1, 2019 International Search Report issued in International Patent Application No. PCT/JP2019/034251.

*Primary Examiner* — Jared Fureman
*Assistant Examiner* — Michael J Warmflash
(74) *Attorney, Agent, or Firm* — Oliff PLC

(57) ABSTRACT

A power transfer apparatus capable of effectively cooling heat generated by wireless power transfer includes: a power transmission coil for performing wireless power transfer; and a heat-dissipating plate for cooling the power transmission coil, the heat-dissipating plate including heat-dissipating members or the like which are divided by gaps along the radial direction of a winding plane of a copper thin-film wire constituting the power transmission coil.

10 Claims, 14 Drawing Sheets

(58) Field of Classification Search
CPC .......... Y02T 90/12; Y02T 90/14; B60L 53/12; B60L 53/302; H01F 27/22; H01F 27/2876; H01F 38/14
See application file for complete search history.

(56) References Cited

U.S. PATENT DOCUMENTS

| | | | |
|---|---|---|---|
| 9,969,282 B2 * | 5/2018 | van Boheemen | H01F 27/22 |
| 10,141,625 B1 * | 11/2018 | Ryu | H05K 7/2039 |
| 10,332,672 B2 * | 6/2019 | Jang | H02J 50/10 |
| 10,446,311 B2 * | 10/2019 | Lu | H01F 27/02 |
| 10,811,904 B2 * | 10/2020 | Lombardi | H02J 50/10 |
| 11,201,500 B2 * | 12/2021 | Partovi | H02J 50/70 |
| 2018/0132376 A1 | 5/2018 | Shin et al. | |

FOREIGN PATENT DOCUMENTS

| | | | | |
|---|---|---|---|---|
| JP | 2010-73976 A | | 4/2010 | |
| JP | 2010073976 A | * | 4/2010 | ............ B60L 53/122 |
| JP | 2013-80785 A | | 5/2013 | |
| JP | 2017-34940 A | | 2/2017 | |
| WO | 2013/183665 A1 | | 12/2013 | |

\* cited by examiner

POWER TRANSFER APPARATUS, POWER TRANSMISSION APPARATUS, POWER RECEPTION APPARATUS, AND POWER TRANSFER SYSTEM

TECHNICAL FIELD

The present invention belongs to a technical field of a power transfer apparatus, a power transmission apparatus, a power reception apparatus, and a power transfer system. More specifically, the present invention belongs to a technical field of a power transfer apparatus for non-contact type power transfer, a non-contact type power transmission apparatus and a non-contact type power reception apparatus using the power transfer apparatus, and a non-contact type power transfer system.

BACKGROUND ART

Recently, for example, an electric vehicle on which a storage battery including a lithium ion battery or the like is mounted has been in widespread use. Such an electric vehicle is moved by driving a motor with power stored in the storage battery, and thus, efficient charge for the storage battery has been required. Therefore, as a method for charging the storage battery mounted on the electric vehicle without physically connecting a charge plug or the like with respect to the electric vehicle, a research on using a power reception coil and a power transmission coil that face each other and are separated from each other, a so-called wireless power transfer has been conducted. In general, examples of the current wireless power transfer method include an electric field coupling method, an electromagnetic induction method, a magnetic field resonance method, and the like. In the case of comparing such methods, for example, from the viewpoint of a usable frequency, a position freedom degree in each of a horizontal direction and a perpendicular direction, a transfer efficiency, and the like, an electric field coupling method using a capacitor or a magnetic field resonance method using a coil has been a promising entry for a wireless power transfer method for charging the storage battery mounted on the electric vehicle, and the research and development thereof has also been actively conducted.

On the other hand, in the wireless power transfer as described above, it is necessary to charge a high-capacity storage battery preferably for a short period of time, and thus, in general, power to be transmitted and received increases. Then, in order to increase the power to be transmitted and received, it is necessary to allow a large current to flow through both of the power reception coil described above and the power transmission coil described above, and large Joule heat is generated in both of the power reception coil and the power transmission coil due to the large current. Accordingly, in particular, in the power reception coil that is mounted on the electric vehicle, it is required to efficiently cool the power reception coil by diffusing the generated Joule heat. Then, examples of the literature of the prior art in which the cooling of the power reception coil and the power transmission coil is disclosed include Patent Document 1 described below. In Patent Document 1, a technology relevant to a heat release member that performs heat release by propagating heat generated in a coil through a circuit including a ferrite core is disclosed.

CITATION LIST

Patent Document

Patent Document 1: WO 2013/183665 A (FIG. 1 and the like)

SUMMARY OF THE INVENTION

Problem to be Solved by the Invention

However, the technology disclosed in Patent Literature 1 described above is applied only to a so-called solenoid type coil, and the heat release member that can be applied to a coil such as the power reception coil described above widely used in the electric vehicle described above, a mobile apparatus, or the like is not disclosed nor indicated. Accordingly, the technology described in Patent Literature 1 described above does not contribute to the cooling of the power reception coil used in the electric vehicle described above or the like. Further, necessary charge can be performed with the transfer of small power by improving a transfer efficiency as the coil, and thus, the flow of a large current is suppressed, and as a result thereof, the generation of Joule heat is also suppressed.

Therefore, the present invention has been made in consideration of the requests and the problems described above, and an example of an object thereof is to provide a power transfer apparatus that is capable of improving a transfer efficiency in a non-contact type power transfer while effectively cooling heat that is generated by the power transfer, a non-contact type power transmission apparatus and a power reception apparatus using the power transfer apparatus, and a power transfer system.

Means for Solving the Problem

In order to solve the above-mentioned problem, the invention described in claim 1 comprises: a transfer means that performs a non-contact type power transfer; and a metallic heat release means that cools the transfer means, wherein the transfer means includes a coil in which a winding wire is wound a plurality of times, and the heat release means is formed in a range including a range facing a region of the coil excluding an inside region from a position of the winding wire wound around an innermost circumference and a range facing an outside region from the position of the winding wire wound around an outermost circumference, in a plane parallel to a winding surface of the winding wire, and includes heat release members divided by one or a plurality of gaps along a radial direction of the winding surface.

According to the invention described in claim 1, a metallic heat release means includes the heat release members divided by one or a plurality of gaps along the radial direction of the winding surface of the winding wire configuring the coil, and thus, a current due to an electromagnetic wave that is generated from a transfer means by the power transfer is divided, and therefore, a transfer efficiency as the power transfer apparatus can also be improved while effectively cooling the transfer means from heat that is generated due to the flow of the current.

In addition, the transfer means includes the coil in which the winding wire is wound a plurality of times, the gap of the heat release means is a gap that is formed along the radial direction of the winding surface, in the plane of the heat release means parallel to the winding surface of the winding wire configuring the coil, and the heat release means includes one or a plurality of heat release members that are divided by the gaps, and thus, the transfer efficiency as the power transfer apparatus can be improved while efficiently cooling the transfer means.

Further, the heat release member is formed in the range facing the region of the coil excluding the inside region from the position of the winding wire wound around the innermost circumference, and thus, the transfer efficiency as the power transfer apparatus can be improved while effectively cooling the coil by suppressing the generation of the current in the heat release means due to the electromagnetic wave that is generated in the inside region.

In addition, the heat release member is formed in the range facing the region of the coil in which the winding wire is wound, and the range facing the outside region from the position of the winding wire wound around the outermost circumference, and thus, the transfer means can be efficiently cooled by increasing the size as the heat release member, that is, as the heat release means.

In order to solve the above-mentioned problem, the invention described in claim 2 and according to claim 1 further comprises: a thermally conductive resin layer between the transfer means and the heat release means.

According to the invention described in claim 2, the thermally conductive resin layer is further provided between the transfer means and the heat release means, and thus, adhesiveness between the transfer means and the heat release means can be increased, and the transfer means can be efficiently cooled while avoiding the risk of discharge from the transfer means, in addition to the function of the invention described in claim 1.

In order to solve the above-mentioned problem, the invention described in claim 3 and according to claim 1 or 2 further comprises: a shielding means that is disposed on a side opposite to a power transmission side of the transfer means at the time of power transmission or a side opposite to a power reception side of the transfer means at the time of power reception when seen from a position of the transfer means and the heat release means, and shields an electromagnetic wave generated by the power transfer; and a magnetic means that is disposed between the transfer means and the heat release means, and the shielding means, and includes a magnetic body, wherein an area of the shielding means and the magnetic means in a plane perpendicular to a straight line toward the shielding means and the magnetic means from the position of the transfer means is greater than or equal to an area of the transfer means in the plane.

According to the invention described in claim 3, a shielding means that is disposed on a side opposite to the power transmission side or a side opposite to the power reception side when seen from the position of the transfer means and the heat release means, and a magnetic means that is disposed between the transfer means and the heat release means, and the shielding means are further provided, and the area of the shielding means and the magnetic means in the plane perpendicular to the straight line toward the shielding means and the magnetic means from the position of the transfer means is greater than or equal to the area of the transfer means in the plane, and thus, the transfer efficiency as the power transfer apparatus can be improved while effectively cooling the transfer means, and a protection target to be protected can be effectively protected from the electromagnetic wave that is generated by the power transfer, in addition to the function of the invention described in claim 1 or 2.

In order to solve the above-mentioned problem, the invention described in claim 4 is the power transfer apparatus according to claim 3, wherein the straight line is a perpendicular line that is erected in a direction toward the shielding means and the magnetic means with a center of the coil as a foot, and an area of a surface perpendicular to the perpendicular line of the shielding means and the magnetic means that are respectively in the shape of a plate is greater than or equal to an area of the winding surface of the winding wire in the coil.

According to the invention described in claim 4, the area of the surface perpendicular to the perpendicular line of the shielding means and the magnetic means that are in the shape of a plate, in which the perpendicular line is erected in the direction toward the shielding means and the magnetic means with the center of the coil as the foot, is greater than or equal to the area of the winding surface of the winding wire in the coil, and thus, the transfer efficiency as the power transfer apparatus can be improved while cooling the transfer means, and the protection target can be effectively protected from the electromagnetic wave that is generated by the power transfer, in addition to the function of the invention described in claim 3.

In order to solve the above-mentioned problem, the invention described in claim 5 is the power transfer apparatus according to claim 4, wherein the transfer means includes a first coil that performs the power transmission or the power reception of power, as the power transfer, and a second coil stacked on the first coil in which power to be subjected to the power transmission is supplied at the time of the power transmission, and power to be subjected to the power reception is output at the time of the power reception.

According to the invention described in claim 5, the transfer means includes the first coil and the second coil concentrically stacked on the first coil, and thus, the transfer efficiency can be improved while cooling the transfer means, and the protection target can be effectively protected from the electromagnetic wave, in addition to the function of the invention described in claim 4.

In order to solve the above-mentioned problem, the invention described in claim 6 is the power transfer apparatus according to claim 5, wherein the first coil includes an out-in winding wire that is wound toward an inner circumference side from an outer circumference side of the first coil, and an in-out winding wire that is wound in a winding direction opposite to the out-in winding wire toward the outer circumference side from the inner circumference side of the first coil, and in the first coil, the out-in winding wire and the in-out winding wire are stacked such that a winding position of the out-in winding wire is coincident with a winding position of the in-out winding wire.

According to the invention described in claim 6, the first coil includes the out-in winding wire and the in-out winding wire, and in the first coil, the out-in winding wire overlaps with the in-out winding wire by interposing an insulating portion therebetween such that the winding center of the out-in winding wire is coincident with the winding center of the in-out winding wire, and thus, the transfer efficiency can be improved while cooling the transfer means and reducing a resonance frequency, and the protection target can be effectively protected from the electromagnetic wave, in addition to the function of the invention described in claim 5.

In order to solve the above-mentioned problem, the invention described in claim 7 is the power transfer apparatus according to claim 5 or 6, wherein in the second coil, a winding wire is wound a plurality of times.

According to the invention described in claim 7, in the second coil, the winding wire is wound a plurality of times, and thus, a transfer efficiency of power can be further improved, in addition to the function of the invention described in claim 5 or 6.

In order to solve the above-mentioned problem, the invention described in claim 8 is the power transfer apparatus according to any one of claims 1 to 7 and further comprises a second heat release means that is thermally connected to and is electrically insulated from any one of the heat release members, on an outer edge of the heat release means.

According to the invention described in claim 8, the second heat release means that is thermally connected to and is electrically insulated from any one of the heat release members, on the outer edge of the heat release means, is further provided, and thus, a cooling effect as the power transfer apparatus can be further increased, in addition to the function of the invention described in any one of claims 1 to 7.

In order to solve the above-mentioned problem, the invention described in claim 9 is a power transmission apparatus provided in a power transfer system that includes the power transmission apparatus and a power reception apparatus separated from the power transmission apparatus, and transfers power to the power reception apparatus from the power transmission apparatus in a non-contact manner, the power transmission apparatus comprises: the power transfer apparatus according to any one of claims 1 to 8; and an output means that outputs power to be transferred to the transfer means of the power transfer apparatus.

In order to solve the above-mentioned problem, the invention described in claim 10 is a power reception apparatus provided in a power transfer system that includes a power transmission apparatus and the power reception apparatus separated from the power transmission apparatus, and transfers power to the power reception apparatus from the power transmission apparatus in a non-contact manner, the power reception apparatus comprises: the power transfer apparatus according to any one of claims 1 to 8; and an input means that is connected to the transfer means of the power transfer apparatus.

In order to solve the above-mentioned problem, the invention described in claim 11 comprises: the power transmission apparatus according to claim 9; and a power reception apparatus that is separated from the power transmission apparatus, is disposed to face the transfer means, and receives power transmitted from the power transmission apparatus.

In order to solve the above-mentioned problem, the invention described in claim 12 comprises: a power transmission apparatus; and the power reception apparatus according to claim 10 that is separated from the power transmission apparatus and receives power transmitted from the power transmission apparatus in which the transfer means is disposed to face the power transmission apparatus.

According to the invention described in any one of claims 9 to 12, the power transmission apparatus or the power reception apparatus includes the power transfer apparatus described in any one of claims 1 to 8, and thus, as the power transfer system, the transfer efficiency as the power transfer apparatus can also be improved while effectively cooling the transfer means.

Effects of the Invention

According to the invention, a metallic heat release means includes the heat release members divided by one or a plurality of gaps along the radial direction of the winding surface of the winding wire configuring the coil.

Therefore, a current due to an electromagnetic wave that is generated from a transfer means by the power transfer is divided, and therefore, a transfer efficiency as the power transfer apparatus can also be improved while effectively cooling the transfer means from heat that is generated due to the flow of the current.

In addition, the transfer means includes the coil in which the winding wire is wound a plurality of times, the gap of the heat release means is a gap that is formed along the radial direction of the winding surface, in the plane of the heat release means parallel to the winding surface of the winding wire configuring the coil, and the heat release means includes one or a plurality of heat release members that are divided by the gaps, and thus, the transfer efficiency as the power transfer apparatus can be improved while efficiently cooling the transfer means.

Further, the heat release member is formed in the range facing the region of the coil excluding the inside region from the position of the winding wire wound around the innermost circumference, and thus, the transfer efficiency as the power transfer apparatus can be improved while effectively cooling the coil by suppressing the generation of the current in the heat release means due to the electromagnetic wave that is generated in the inside region.

In addition, the heat release member is formed in the range facing the region of the coil in which the winding wire is wound, and the range facing the outside region from the position of the winding wire wound around the outermost circumference, and thus, the transfer means can be efficiently cooled by increasing the size as the heat release member, that is, as the heat release means.

MODES FOR CARRYING OUT THE INVENTION

Next, modes for carrying out the present invention will be described on the basis of the drawings. Note that, an embodiment and each modification embodiment described below are embodiments in the case of applying the present invention to a power transfer system in which power for charging a rechargeable battery that is mounted on an electric vehicle is transmitted to the electric vehicle including the rechargeable battery in a non-contact manner by a magnetic field resonance method, respectively.

Here, the power transfer system using the magnetic field resonance method of the embodiment and each of the modification embodiments includes a power transmission coil that transmits power, and a power reception coil that is disposed separated from the power transmission coil to be opposite to each other (that is, to face each other) and receives power transmitted from the power transmission coil. Then, the power transmission coil described above has a configuration in which a power transmission loop coil described below and a power transmission open coil described below are respectively stacked. In addition, the power reception coil described above has a configuration in which a power reception open coil described below and a power reception loop coil described below are respectively stacked.

(I) Embodiment

First, an embodiment of the present invention will be described by using FIG. 1 to FIG. 7.

(i) Overall Configuration and Operation of Power Transfer System of Embodiment

First, the overall configuration and the operation of a power transfer system of an embodiment will be described by using FIG. 1 and FIG. 2. Note that, FIG. 1 is a block figure illustrating the outline configuration of the power transfer system of the embodiment, and FIG. 2 is a perspective view conceptually illustrating the structure of the power transfer system.

Figure 1:
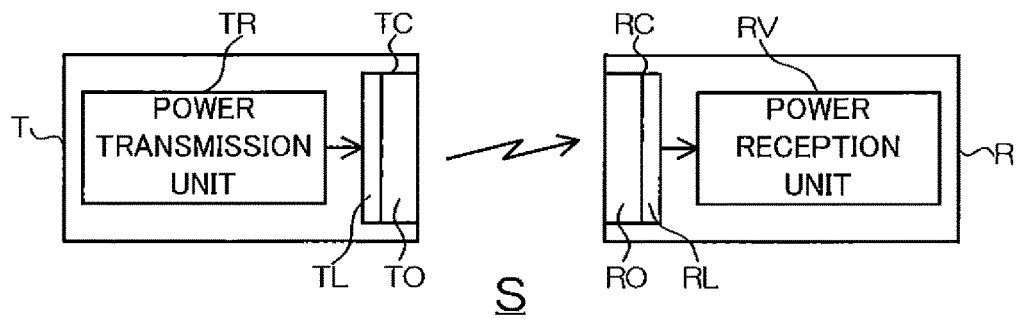
FIG. 1 is a block figure illustrating an outline configuration of a power transfer system of an embodiment.
Figure 2:
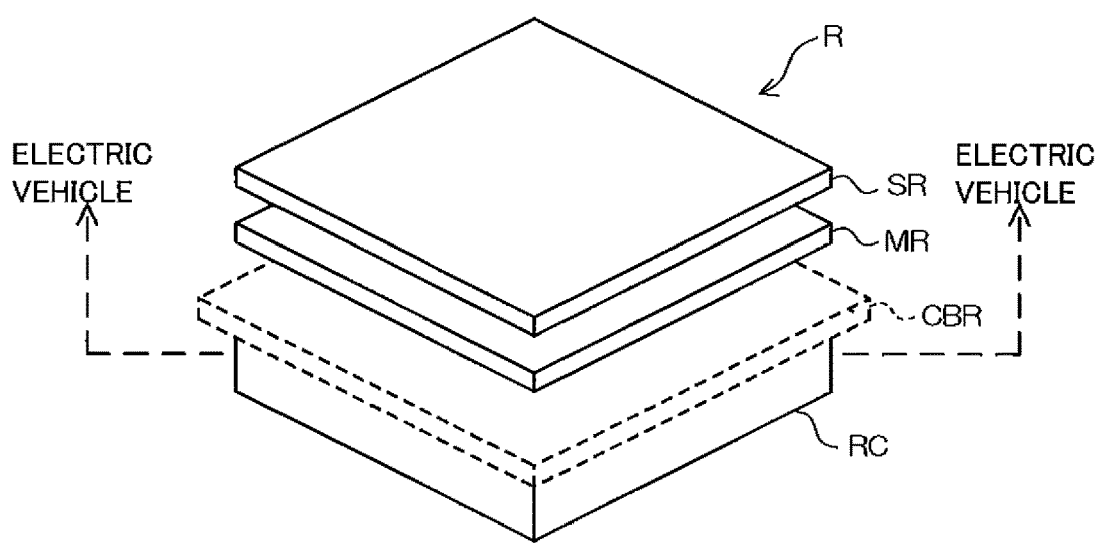
FIG. 2 is a perspective view conceptually illustrating a structure of the power transfer system of the embodiment.
Figure 2:
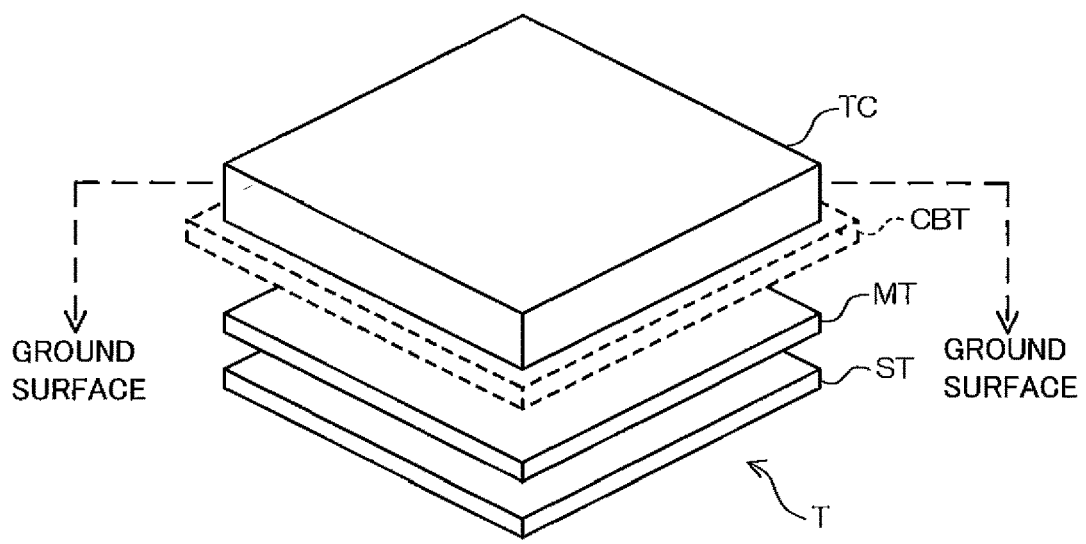

As illustrated in the block figure of FIG. 1, a power transfer system S of the embodiment includes a power reception apparatus R including a power reception unit RV and a power reception coil RC described above, and a power transmission apparatus T including a power transmission unit TR and a power transmission coil TC described above. At this time, the power reception apparatus R is mounted on the electric vehicle described above, and is connected to a storage battery mounted on the electric vehicle that is not illustrated. On the other hand, the power transmission apparatus T is provided on the ground surface in a position where the electric vehicle is moved or stops. Then, in a case where the storage battery is charged, the electric vehicle is driven or stops such that the power reception coil RC of the power reception apparatus R and the power transmission coil TC of the power transmission apparatus T face each other. Note that, when the storage battery described above is charged by the power transfer system S of the embodiment, power can be transferred to the power reception apparatus R mounted on the electric vehicle that stops from the power transmission apparatus T through the power transmission coil TC of the power transmission apparatus T provided on the ground surface below the stopping position. In addition, power may be continuously transferred to the power reception apparatus R mounted on the electric vehicle that is being moved from the power transmission apparatus T through the power transmission coils TC of a plurality of power transmission apparatuses T provided in sections with a constant distance on the road where the electric vehicle is being moved. Then, the power transmission apparatus T described above or the power reception apparatus R described above correspond to an example of a "power transfer apparatus" of the present invention, the power transmission coil and the power reception coil RC described above correspond to an example of a "transfer means" of the present invention, the power transmission unit TR described above corresponds to an example of an "output means" of the present invention, and the power reception unit RV described above corresponds to an example of an "input means" of the present invention. Further, in FIG. 1, the power reception coil RC side of the power transmission coil TC corresponds to a "power transmission side" of the power transmission coil TC, and the power transmission coil TC side of the power reception coil RC corresponds to a "power reception side" of the power reception coil RC.

On the other hand, the power transmission coil TC described above includes a power transmission loop coil TL and a power transmission open coil TO. In addition, the power reception coil RC described above includes a power reception open coil RO and a power reception loop coil RL. At this time, power to be transmitted is input into the power transmission loop coil TL from the power transmission unit TR. Then, the power transmission open coil TO is concentrically stacked on the power transmission loop coil TL in which both ends thereof are an open end. On the other hand, the power reception open coil RO is disposed on the power transmission open coil TO to face each other in which both ends thereof are an open end. Then, the power reception loop coil RL is concentrically stacked on the power reception open coil RO in which power received from the power transmission coil TC by the magnetic field resonance method is output to the power reception unit RV. At this time, the power transmission open coil TO or the power reception open coil RO corresponds to an example of a "first coil" of the present invention, and the power transmission loop coil TL or the power reception loop coil RL corresponds to an example of a "second coil" of the present invention.

In the configuration described above, the power transmission unit TR of the power transmission apparatus T, for example, outputs power to be transferred to the power reception apparatus R to the power transmission coil TC while complying with a law or the like such as a radio law in a country where the power transfer system S is used. At this time, in the law or the like described above, for example, a leaked magnetic field is regulated to be less than or equal to a predetermined level set in advance, in consideration of a danger to the human body. Examples of the law or the like relevant to the regulation of the leaked magnetic field include a guideline set by International Commission on Non-Ionizing Radiation Protection (ICNIRP: published in 2010). In addition, in order to enable mutual connection between all of the power transmission apparatuses T and the power reception apparatus R described above to be used, as a result, it is necessary for both of the power transmission apparatus and the power reception apparatus to use a frequency in a predetermined range set in advance, and thus, it is necessary for the frequency in the predetermined range described above or a frequency band to follow the recommendation of an international organization such as International Organization for Standardization (ISO) or International Electrotechnical Commission (IEC), as the law or the like described above. Further, a lower limit value of a transfer efficiency that also considers a predetermined positional shift between the power transmission coil TC and the power reception coil RC is also defined by the international organization described above, and thus, a high power transfer efficiency is required.

On the other hand, the power reception coil RC of the power reception apparatus R that receives power from the power transmission coil TC by the magnetic field resonance method described above outputs the received power to the power reception unit RV. Accordingly, the power reception unit RV converts output corresponding to the power (for example, high-frequency power of 85 kilohertz), for example, into a direct-current (DC) current by a power conversion unit that is not illustrated, and outputs the DC current to the storage battery of the electric vehicle. Accordingly, a necessary amount of power is charged in the storage battery.

In addition, as illustrated in the upper portion of FIG. 2, in the power reception coil RC the power reception apparatus R described above of the power transfer system S of the embodiment, a heat release plate CBR of the embodiment is stacked above the power reception coil RC (the upper side in FIG. 2) by interposing an insulating resin layer (not illustrated in FIG. 2) having excellent thermal conductivity therebetween. The heat release plate CBR is a plate-shaped heat release plate for cooling the power reception coil RC itself by diffusing the Joule heat described above that is generated in the power reception coil RC as a result of receiving power from the power transmission coil TC through the resin layer described above, and includes a plurality of heat release members described below. Note that, in FIG. 2, an external perspective view of only the outline of the heat release plate CBR of the embodiment that is stacked on the power reception coil RC is illustrated by using a broken line.

Further, in the power reception apparatus R, a magnetic plate MR and a shielding plate SR for reducing the leaked magnetic field described above from the power reception coil RC are stacked between the lower surface of the vehicle body of the electric vehicle in which the power reception apparatus R is mounted and the power reception apparatus R described above (more specifically, as illustrated in FIG. 2, between the heat release plate CBR and the lower surface of the vehicle body). At this time, the shielding plate SR may be provided as an exterior plate or a component in a position where the power reception coil RC is provided on the lower surface of the vehicle body of the electric vehicle described above. In addition, each of the heat release plate CBR, the magnetic plate MR, and the shielding plate SR may be closely stacked, or may be stacked separated at a distance that is optimized in advance. In addition, the area of the surface of the magnetic plate MR and the shielding plate SR facing the heat release plate CBR is greater than the area of a winding surface of a coil described below that is included in the power reception coil RC, and it is preferable that the area is less than or equal to four times the area of the winding surface (that is, two times in terms of one side of a square exemplified in FIG. 2).

On the other hand, as illustrated in the lower portion of FIG. 2, in the power transmission coil TC of the power transmission apparatus T described above of the power transfer system S of the embodiment, a heat release plate CBT of the embodiment is stacked below the power transmission coil TC (the lower side in FIG. 2) by interposing an insulating resin layer (not illustrated in FIG. 2) having excellent thermal conductivity therebetween. The heat release plate CBT is a plate-shaped heat release plate for cooling the power transmission coil TC itself by diffusing the Joule heat described above that is generated in the power transmission coil TC as a result of transmitting power to the power reception coil RC through the resin layer described above, and includes a plurality of heat release members described below. Note that, in FIG. 2, as with the heat release plate CBR, an external perspective view of only the outline of the heat release plate CBT of the embodiment is illustrated by using a broken line. In addition, the heat release plate CBR described above and the heat release plate CBT described above have the same configuration, and the details of each of the heat release plate CBR and the heat release plate CBT will be described below by using FIG. 7, as the details of the configuration of the heat release plate CBT.

Further, in the power transmission apparatus T, a magnetic plate MT and a shielding plate ST for reducing the leaked magnetic field described above from the power transmission coil TC are stacked between the ground surface in a position where the power transmission apparatus T is provided and the power transmission apparatus T described above (more specifically, as illustrated in FIG. 2, between the heat release plate CBT and the ground surface). At this time, each of the heat release plate CBT, the magnetic plate MT, and the shielding plate ST may be closely stacked, or may be stacked separated at a distance that is optimized in advance. In addition, the area of the surface of the magnetic plate MT and the shielding plate ST facing the heat release plate CBT is greater than the area of a winding surface of a coil described later that is included in the power transmission coil TC, and it is preferable that the area is less than or equal to four times the area of the winding surface (that is, two times in terms of one side of a square exemplified in FIG. 2).

Further, it is preferable that a material of which a relative magnetic permeability, for example, is greater than or equal to 100 is used as the material of each of the magnetic plate MR and the magnetic plate MT described above. In this case, examples of the material of which the relative magnetic permeability is greater than or equal to 100 include iron, nickel, cobalt, an alloy including these (for example, a nickel-zinc-based soft magnetic material), and the like. Note that, from the viewpoint of preventing a breakage, it is preferable that a magnetic body as a material is pulverized, is mixed with a resin or the like, and is fixed to be the magnetic plate MR and the magnetic plate MT such that the magnetic plate MR and the magnetic plate MT themselves have flexibility. Further, from the viewpoint of reducing an induction current, it is preferable that a material of which the electroconductivity, for example, is less than or equal to $10^3$ siemens/meters (S/m) is used as the material of the magnetic plate MR and the magnetic plate MT. In addition, it is preferable that the thickness of each of the magnetic plate MR and the magnetic plate MT themselves, for example, is approximately 0.1 millimeters to 2 millimeters. In contrast, it is preferable that a material of which the electroconductivity, for example, is greater than or equal to $10^4$ siemens/meters (S/m) is used as the material of each of the shielding plate SR and the shielding plate ST described above. In this case, examples of the material of which the electroconductivity is greater than or equal to $10^4$ siemens/meters include carbon fiber reinforced plastic (CFRP), copper, aluminum, iron (for example, stainless steel as an exterior material of the electric vehicle), and the like.

Then, in the configuration described above, the heat release plate CBR and the heat release plate CBT correspond to an example of a "heat release means" according to the present invention, the magnetic plate MR and the magnetic plate MT correspond to an example of a "magnetic means" according to the present invention, and the shielding plate SR and the shielding plate ST correspond to an example of a "shielding means" according to the present invention.

(ii) Configuration of Power Transmission Coil TC (Power Reception Coil RC)

Figure 3:
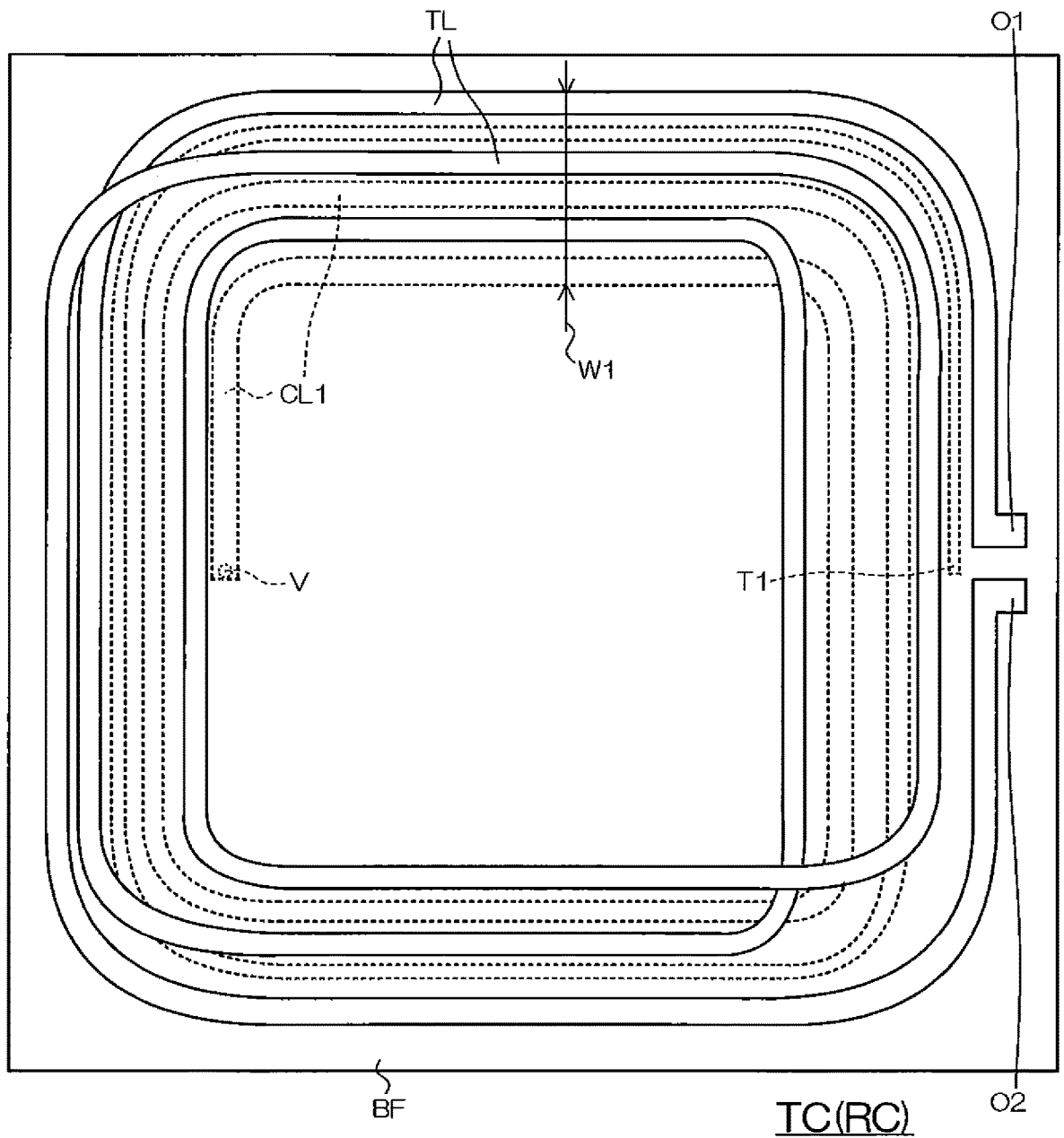
FIG. 3 is a plan view (i) illustrating a structure of a power transmission coil of the embodiment.
Figure 4:
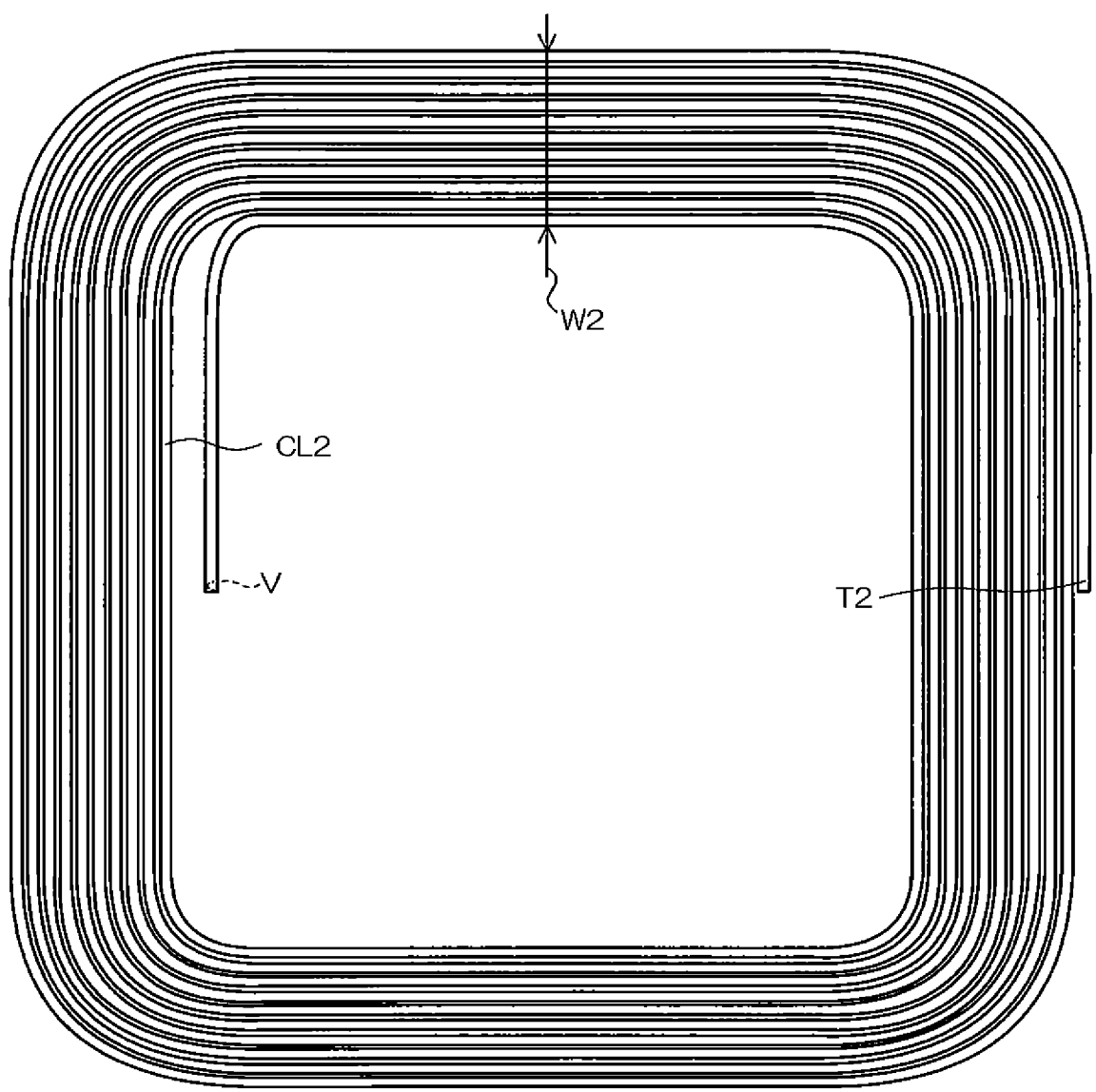
FIG. 4 is a plan view (ii) illustrating the structure of the power transmission coil of the embodiment.
Figure 5:
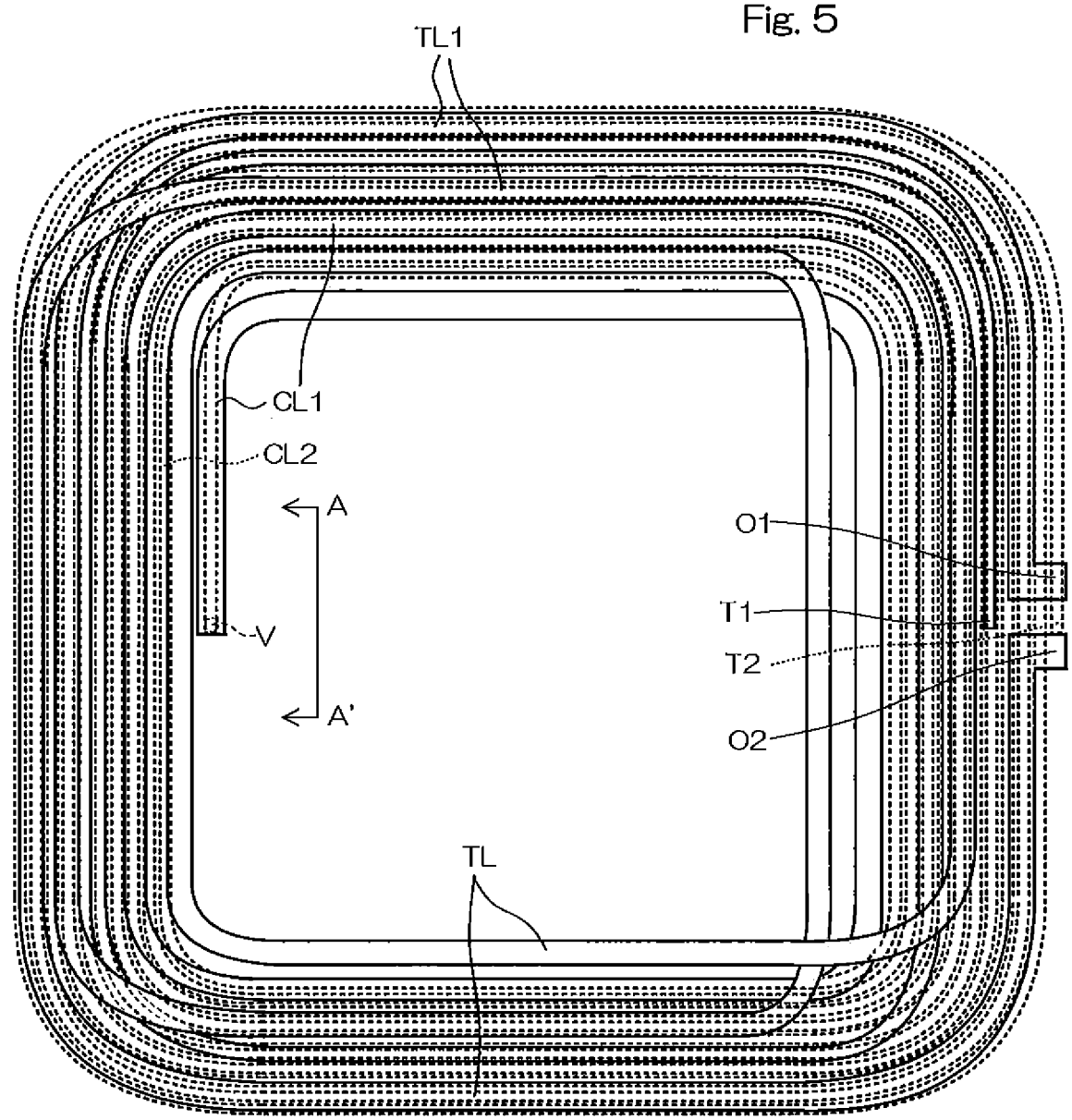
FIG. 5 is a plan view (iii) illustrating the structure of the power transmission coil of the embodiment.
Figure 6:
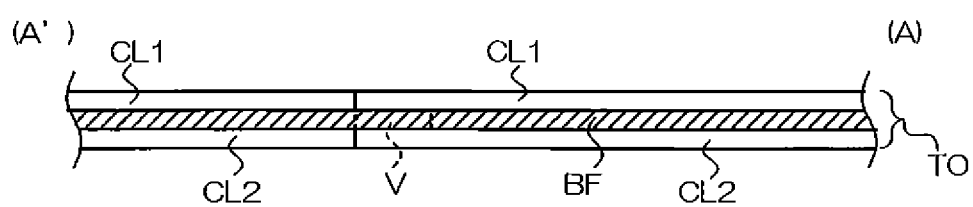
FIG. 6 is a partial sectional view illustrating the structure of the power transmission coil of the embodiment.

Next, the details of the configuration of the power transmission coil TC and the power reception coil RC described above will be described by using FIG. 3 to FIG. 6. Note that, the power transmission coil TC and the power reception coil RC of the embodiment basically have the same configuration. That is, it is preferable that the configuration of the power transmission loop coil TL described above is basically identical to the configuration of the power reception loop coil RL described above. In addition, it is preferable that the configuration of the power transmission open coil TO described above is basically identical to the configuration of the power reception open coil RO described above. Further, it is preferable that a position relationship between the power transmission loop coil TL and the power transmission open coil TO described above in the power transmission coil TC is basically identical to a position relationship between the power reception loop coil RL and the power reception open coil RO described above in the power reception coil RC. Accordingly, in the following description, the structure of the power transmission coil TC will be described. Note that, the size of the power transmission coil TC may be larger than that of the power reception coil RC. In addition, FIG. 3 to FIG. 5 are plan views illustrating the structure of the power transmission coil TC of the embodiment, and FIG. 6 is a partial sectional view illustrating the structure of the power transmission coil TC of the embodiment. At this time, FIG. 3 to FIG. 5 are plan views when the power transmission coil TC is seen from the power transmission unit TR side (the heat release plate CBT side in FIG. 2) in the power transmission apparatus T.

As illustrated in the plan view of FIG. 3, the power transmission coil TC of the embodiment has a configuration in which the power transmission loop coil TL, and the power transmission open coil TO in which a coil CL1 that is a part thereof is illustrated by a broken line in FIG. 3 are stacked in a paper surface direction of FIG. 3 through an insulating film BF (the details will be described below). Note that, as illustrated in FIG. 3, the power transmission loop coil TL and the coil CL1 described above are formed on the same layer in the power transmission coil TC. On the other hand, the power transmission open coil TO has a configuration in which the coil CL1 described above that is illustrated by a broken line in FIG. 3, and a coil CL2 that is not illustrated in FIG. 3 are stacked in the paper surface direction of FIG. 3 through the film BF described above. Note that, in the embodiment, the film BF is used in order to insulate between the coil CL1 of the power transmission open coil TO and the power transmission loop coil TL, and the coil CL2 of the power transmission open coil TO, and an insulating material such as a glass epoxy material can also be used. In addition, in order to efficiently release the generated heat as the power transmission coil TC, for example, a material for a thin film in which ceramic particles and the like are dispersed can also be used. Further, the winding centers of copper thin film wires described below that configure the power transmission loop coil TL, the coil CL1, and the coil CL2, respectively, are identical or approximately identical to each other. Further, in addition, the surface on which the power transmission loop coil TL and the coil CL1 are formed, illustrated in FIG. 3, corresponds to the lower surface of the power transmission coil TC, in FIG. 2.

Then, as illustrated in FIG. 3, the power transmission loop coil TL includes a connection terminal O1 and a connection terminal O2 that are connected to the power transmission unit TR, on one side of the outermost circumference portion. In addition, the power transmission loop coil TL, for example, has a configuration in which the copper thin film wire is wound in three rotations (three turns) in the same layer of the power transmission coil TC as that of the coil CL1, in which both end portions (in FIG. 3, the center of the right side portion) are the connection terminal O1 and the connection terminal O2 described above. Note that, the copper thin film wire described above that configures the power transmission loop coil TL has the same width and the same thickness over the entire circumference of the power transmission loop coil TL. Further, in the power transmission loop coil TL, linear portions are provided in the upper side portion, the lower side portion, the left side portion, and the right side portion in FIG. 3, respectively, and the linear portions are connected through curve portions, respectively. Note that, in FIG. 3, mutual insulation in a position where the power transmission loop coil TL intersects with the coil CL1, and mutual insulation in a position where the copper thin film wires themselves configuring the power transmission loop coil TL intersect with each other, for example, are respectively maintained by forming a jumper wire such that one exceeds the other.

On the other hand, as a relationship in the copper thin film wires configuring the power transmission loop coil TL, the coil CL1, and the coil CL2 described above, respectively, a width to which the entire width of one side in the winding of the power transmission loop coil TL and the entire width of one side in the winding of the coil CL1 are added (illustrated by a reference numeral "W1" in FIG. 3) is approximately identical to the entire width of corresponding side in the winding of the coil CL2, as with a first embodiment.

On the other hand, in the coil CL1 configuring the power transmission open coil TO that is formed on the same layer of the power transmission coil TC as that of the power transmission loop coil TL described above, the outermost circumference portion thereof is an open end T1, as illustrated by the broken line in FIG. 3. Then, the coil CL1 has a configuration in which, for example, the copper thin film wire is wound into the shape of a spiral in two and a half rotations (2.5 turns), in a counterclockwise direction starting from the open end T1, toward the innermost circumference portion from the outermost circumference portion. In addition, a via V for configuring electric connection with respect to the coil CL2 that is stacked directly below the coil CL1 in the paper surface direction of FIG. 3 is connected to the innermost circumference portion. Note that, the copper thin film wire described above that configures the coil CL1 has the same thickness over the entire circumference of the coil CL1. In contrast, as illustrated in FIG. 3, the width of the copper thin film wire increases toward a portion in the innermost circumference end portion to which the via V is connected from the open end T1 in the outermost circumference end portion of the coil CL1. Further, in the coil CL1, linear portions parallel to each other are provided in the upper side portion, the lower side portion, the left side portion, and the right side portion in FIG. 3, respectively, and the linear portions are connected through curve portions approximately in the shape of a concentric circular arc, respectively. Then, the width of the copper thin film wire configuring the coil CL1 is constant in each of the linear portions, but increases toward the innermost circumference end portion in each of the curve portions for connecting the linear portions. At this time, the width of the copper thin film wire configuring the coil CL1 may increase toward the innermost circumference end portion from the outermost circumference end portion, as the entire coil CL1, and even in a case where the width decreases toward the innermost circumference end portion from the outermost circumference end portion, for example, temporarily (partially), the effect of the power transfer using the power transfer system S of the embodiment is not affected. The coil CL1 corresponds to an example of an "out-in winding wire" according to the present invention.

Next, the configuration of the coil CL2 configuring the power transmission open coil TO that is stacked directly below the power transmission loop coil TL and the coil CL1 described above via the film BF described above will be described by using FIG. 4. Note that, FIG. 4 is a plan view illustrating only the coil CL2 by taking out the coil CL2.

As illustrated in FIG. 4, in the coil CL2 configuring the power transmission open coil TO, along with the coil CL1 described above, the via V described above for configuring electric connection with respect to the coil CL1 described above is connected to the innermost circumference portion. That is, the coil CL1 and the coil CL2 are connected in series over the transmission of the power transmission coil TC. Then, the coil CL2 has a configuration in which, for example, the copper thin film wire is wound into the shape of a spiral in ten and a half rotations (10.5 turns), in a clockwise direction starting from the via V (that is, a direction opposite to the coil CL1), toward the outermost circumference portion from the innermost circumference portion. In addition, the outermost circumference portion is an open end T2. Note that, as illustrated in FIG. 4, a position in the coil CL2 to which the via V is connected is shifted inwardly in a radial direction of the coil CL2 to be aligned with the coil CL1. In addition, the copper thin film wire described above that configures the coil CL2 has the same width and the same thickness over the entire circumference of the coil CL2. Further, in the coil CL2, as with the coil CL1, linear portions parallel to each other are provided in the upper side portion, the lower side portion, the left side portion, and the right side portion in FIG. 3, and each the linear portions is connected through curve portions approximately in the shape of a concentric circular arc, respectively.

Here, as a relationship in copper thin film wires configuring the power transmission loop coil TL, the coil CL1, and the coil CL2 described above, respectively, each of the copper thin film wires is wound such that the number of windings of the copper thin film wire of the coil CL1 that is wound in the counterclockwise direction described above (two and a half rotations (2.5 turns)) is different from the number of windings of the copper thin film wire of the coil CL2 that is wound in the clockwise direction described above (ten and a half rotations (10.5 turns)), in the same layer as that of the power transmission loop coil TL. In addition, the width of the copper thin film wire of the coil CL2 is generally narrower than the width of the copper thin film wire of the coil CL1 such that the width W1 to which the entire width of one side in the winding of the power transmission loop coil TL and the entire width of one side in the winding of the coil CL1 are added (refer to FIG. 3) is approximately identical to the entire width of one corresponding side in the winding of the coil CL2 (illustrated by a reference numeral "W2" in FIG. 4). Then, the coil CL1 and the coil CL2 are connected in series through the via V connected to each of the innermost circumference portions. Accordingly, the winding to the innermost circumference portion from the outermost circumference portion of the coil CL1 is switched back (folded back) in an opposite direction in the innermost circumference portion, and thus, the coil CL2 is wound to the outermost circumference portion from the innermost circumference portion. The coil CL2 corresponds to an example of an "in-out winding wire" according to the present invention.

Next, a position relationship in the copper thin film wires that configure the power transmission loop coil TL and the power transmission open coil TO described above (that is, the coil CL1 and the coil CL2 described above), respectively, will be described by using FIG. 5. Note that, FIG. 5 is a plan view illustrating a state in which the power transmission loop coil TL and the coil CL1 overlap with the coil CL2, in which the power transmission loop coil TL and the coil CL1 are illustrated by a solid line, and the coil CL2 that is stacked directly below the power transmission loop coil TL and the coil CL1 via the film BF (not illustrated in FIG. 5) is illustrated by a broken line, respectively.

As illustrated by the solid line in FIG. 5, in the coil CL1 that is wound toward the inner circumference from the outer circumference and is connected to the coil CL2 through the via V in the innermost circumference portion, each of the curve portions is formed and the copper thin film wire is wound such that the position of the linear portion is shifted to the inner circumference side by a quarter of the pitch in the winding of the copper thin film wire (that is, a distance between the center lines of the adjacent copper thin film wires on each of the sides, in the radial direction of the winding, and the same applies to the followings), for each quarter circle.

On the other hand, as illustrated by the solid line in FIG. 5, the power transmission loop coil TL is stacked along each of the sides of the coil CL2, and each of the connection terminal O1 and the connection terminal O2 protrudes to the outside the winding. Further, as illustrated by the broken line in FIG. 5, even in the coil CL2 that is wound toward the outer circumference from the inner circumference and is connected to the coil CL1 in series through the via V in the innermost circumference portion, each of the curve portions is formed and the copper thin film wire is wound such that the position of the linear portion is shifted to the outer circumference side by a quarter of the pitch in the winding of the copper thin film wire, for each quarter circle. Then, as illustrated in FIG. 5, the power transmission loop coil TL in which the coil CL1 described above is wound around the inner circumference side is stacked along each of the sides of the coil CL2.

As illustrated in FIG. 5, in the power transmission coil TC in which the power transmission loop coil TL and the coil CL1, and the coil CL2 are stacked, the copper thin film wires configuring the power transmission loop coil TL and the power transmission open coil TO (the coil CL1 and the coil CL2), respectively, are stacked to approximately overlap with each other, on each of the up, down, right, and left sides.

Next, a stacked state of the power transmission loop coil TL and the coil CL1, and the coil CL2 described above, and a connection state between the coil CL1 and the coil CL2 will be described by using FIG. 6 as a sectional view of an A-A' part illustrated in FIG. 5.

As illustrated in FIG. 6, in the left side portion of FIG. 3 to FIG. 5, the coil CL1 and the coil CL2 are stacked by interposing the film BF therebetween, and the coil CL1 and the coil CL2 are electrically connected to each other through the via V. The winding of the coil CL1 in the counterclockwise direction described above is switched back (folded back) in the position of the via V, and thus, the winding of the coil CL2 in the clockwise direction described above is formed. On the other hand, even though it is not illustrated in FIG. 6, the power transmission loop coil TL is stacked in the same layer as that of the coil CL1, and the coil CL1 and the power transmission loop coil TL are insulated from each other.

(iii) Configuration of Heat Release Plate CBT (Heat Release Plate CBR)

Next, the details of the configuration of the heat release plate CBT and the heat release plate CBR of the embodiment described above will be described by using FIG. 7. Note that, the heat release plate CBT and the heat release plate CBR of the embodiment basically have the same configuration, as described above. Accordingly, in the following description, the structure of the heat release plate CBT that is stacked on the power transmission coil TC through the resin layer described above will be described. In addition, FIG. 7(*a*) is a plan view illustrating the structure of the heat release plate of the embodiment, and is a plan view when the heat release plate CBT is seen from the power transmission unit TR side (in FIG. 2, the side of the magnetic plate MT and the shielding plate ST), in the power transmission apparatus T. Further, FIG. 7(*b*) is a side view when the power transmission coil TC of the embodiment that is provided with the heat release plate CBT is seen from a lower direction to an upper direction in FIG. 7(*a*). Note that, in FIG. 7(*a*), the power transmission loop coil TL and the coil CL1 in the power transmission coil TC on which the heat release plate CBT is stacked are illustrated by a broken line.

Figure 7A:
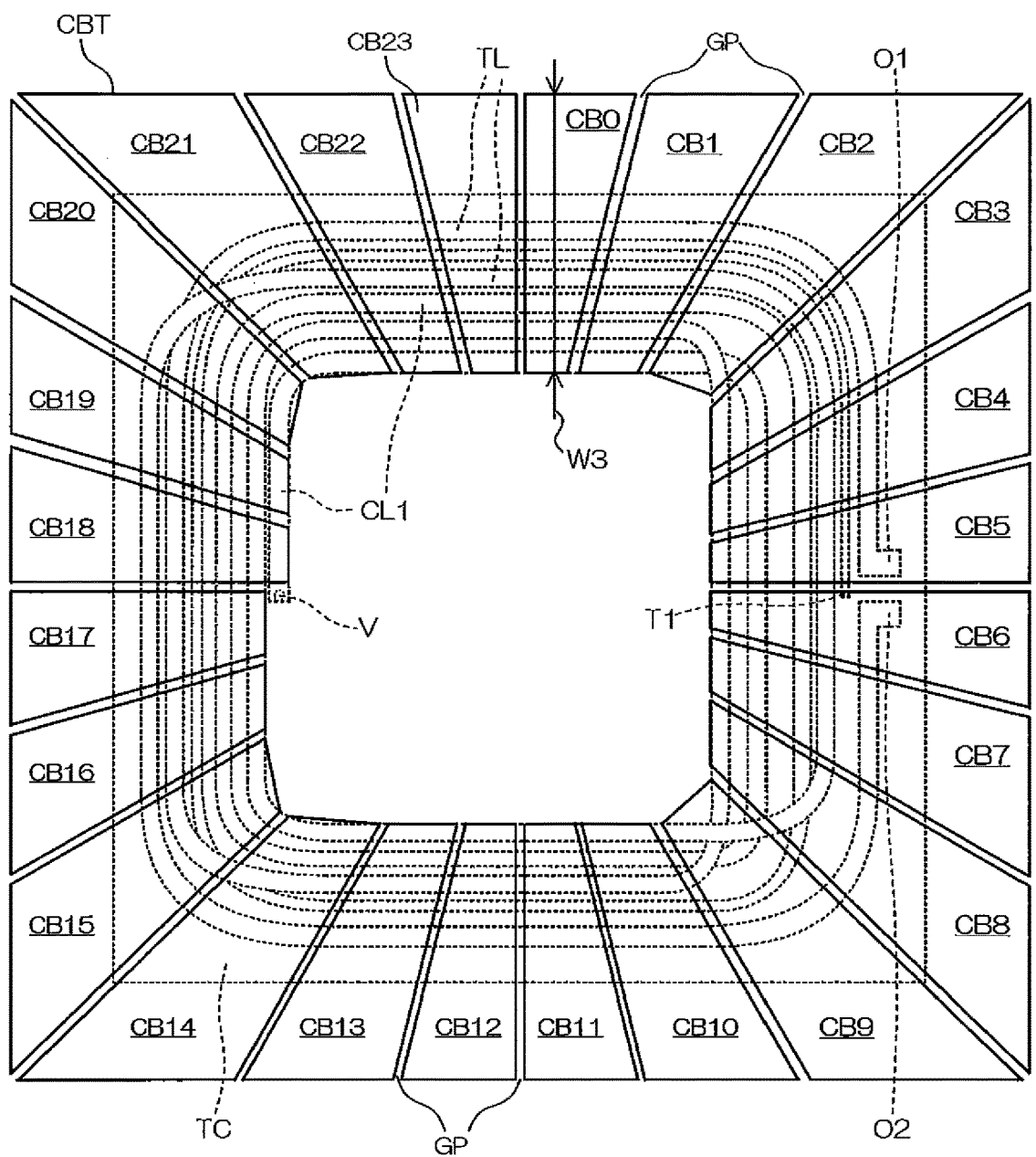
FIG. 7 is a plan view or the like illustrating a structure of a heat release plate of the embodiment, in which (a) is the plan view, and (b) is a side view of the power transmission coil including the heat release plate of the embodiment.
Figure 7B:
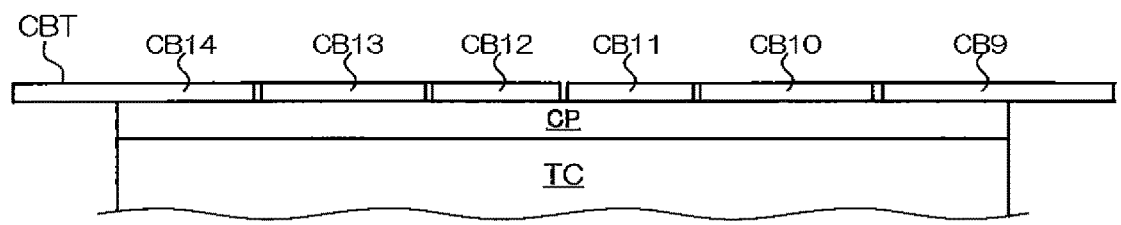

As illustrated in FIG. 7(*a*), the heat release plate CBT of the embodiment is formed as an aggregation of 24 heat release member CB0 to heat release member CB23 divided by gaps GP that are radially formed with the center of the power transmission coil TC as a center, and have a width of approximately 1 millimeter. Each of the heat release member CB0 to the heat release member CB23, for example, is formed of a metal plate that has excellent thermal conductivity and is in the shape of a flat plate (for example, an aluminum plate having a thickness of 0.1 millimeters to 5 millimeters), and all of the heat release members are stacked on the power transmission coil TC in the same plane. In addition, as illustrated in FIG. 7(*a*), the shape of the outer edge of the heat release plate CBT including the heat release member CB0 to the heat release member CB23 together is approximately similar to the shape of the outer edge of the power transmission coil TC. Further, the shape of the inner edge of the heat release plate CBT is a shape along the inner edge of the innermost circumference portion of the power transmission coil TC including the power transmission loop coil TL and the coil CL1. Then, the length of each of the heat release member CB0 to the heat release member CB23 in the radial direction of the power transmission coil TC (illustrated by a reference numeral "W3" in FIG. 7) is approximately twice the width to which the width of the copper thin film wire configuring the power transmission loop coil TL and the entire width of one side in the winding of the coil CL1 are added (refer to the reference numeral "W1" in FIG. 3). For this reason, the position of the outer edge of the heat release plate CBT described above is outside the outer edge of the power transmission coil TC when seen from the center of the power transmission coil TC.

Here, it is considered that the reason that the gap GP in the heat release plate CBT is radially formed as described above is because in a case where the entire heat release plate is formed of one metal plate without having the gap GP (refer to a third comparative example described below), the generation of an eddy current (an eddy current as an induction current) in the heat release plate due to the transmission of power from the power transmission coil TC increases, and thus, the heat release plate itself becomes a heat generation source and a radiation source of an electromagnetic wave. For this reason, the heat release plate CBT of the embodiment includes a plurality of heat release member CB0 to heat release member CB23 with the radial gaps GP (in other words, the gaps GP in a direction intersecting with the eddy current described above), in order to suppress the generation of the eddy current.

On the other hand, as illustrated in FIG. 7(*b*), the heat release plate CBT of the embodiment is stacked on the power transmission coil TC by interposing the insulating resin layer CP described above therebetween. The resin layer CP is a resin layer having flexibility. The heat release plate CBT is stacked on the power transmission coil TC by interposing the resin layer CP therebetween, and thus, a sufficient heat release effect by using the heat release plate CBT formed of a metal plate and a heat release effect by improving adhesiveness between the power transmission coil TC and the heat release plate CBT (a contact area ratio) are compatible. In addition, the heat release plate CBT is stacked on the power transmission coil TC by interposing the resin layer CP therebetween, and thus, discharge that is caused by directly stacking the heat release plate CBT on the power transmission coil TC is prevented. Specifically, for example, a so-called thermal conductive sheet formed of a non-silicone-based acrylic sheet can be used as the resin layer CP, and as a desirable specification thereof, it is preferable to use a material having a thickness of approximately 1 millimeter, a thermal conductance rate of approximately 5 watts/meter·kelvin (W/m·k), and a volume resistivity of approximately $1.0 \times 10^{11}$ ohms·centimeter ($\Omega$·cm).

(II) Modification Embodiment

Next, modification embodiments of the present invention will be described by using FIG. 8 to FIG. 12. Each of the modification embodiments described below are embodiments in which the shape of the heat release plate CBT of the embodiment is variously modified. At this time, the structure and the like of each of a power transmission coil (or a power reception coil) on which a heat release plate of each of the modification embodiments is stacked and a resin layer are the same as those of the power transmission coil TC (or the power reception coil RC) of the embodiment. Accordingly, in FIG. 8 to FIG. 12, the same reference numerals will be applied to the same configuration members as those of the power transmission coil TC of the embodiment, and the detailed description thereof will be omitted. In addition, in FIG. 8 to FIG. 12, the power transmission loop coil TL and the coil CL1 of the power transmission coil TC of each of the modification embodiments on which the heat release plate of each of the modification embodiments is stacked are illustrated by a broken line.

Further, the heat release plate provided in a power transmission apparatus of each of the modification embodiments, and the heat release plate provided in a power reception apparatus of each of the modification embodiments have the same configuration. Accordingly, in the following description, the heat release plate provided in the power transmission apparatus of each of the modification embodiments will be described.

(i) First Modification Embodiment

First, a first modification embodiment will be described by using FIG. 8. Note that, FIG. 8 is a plan view illustrating the structure of a heat release plate of the first modification embodiment, and is a plan view when the heat release plate of the first modification embodiment is seen from a power transmission unit side of the first modification embodiment in a power transmission apparatus of the first modification embodiment.

Figure 8:
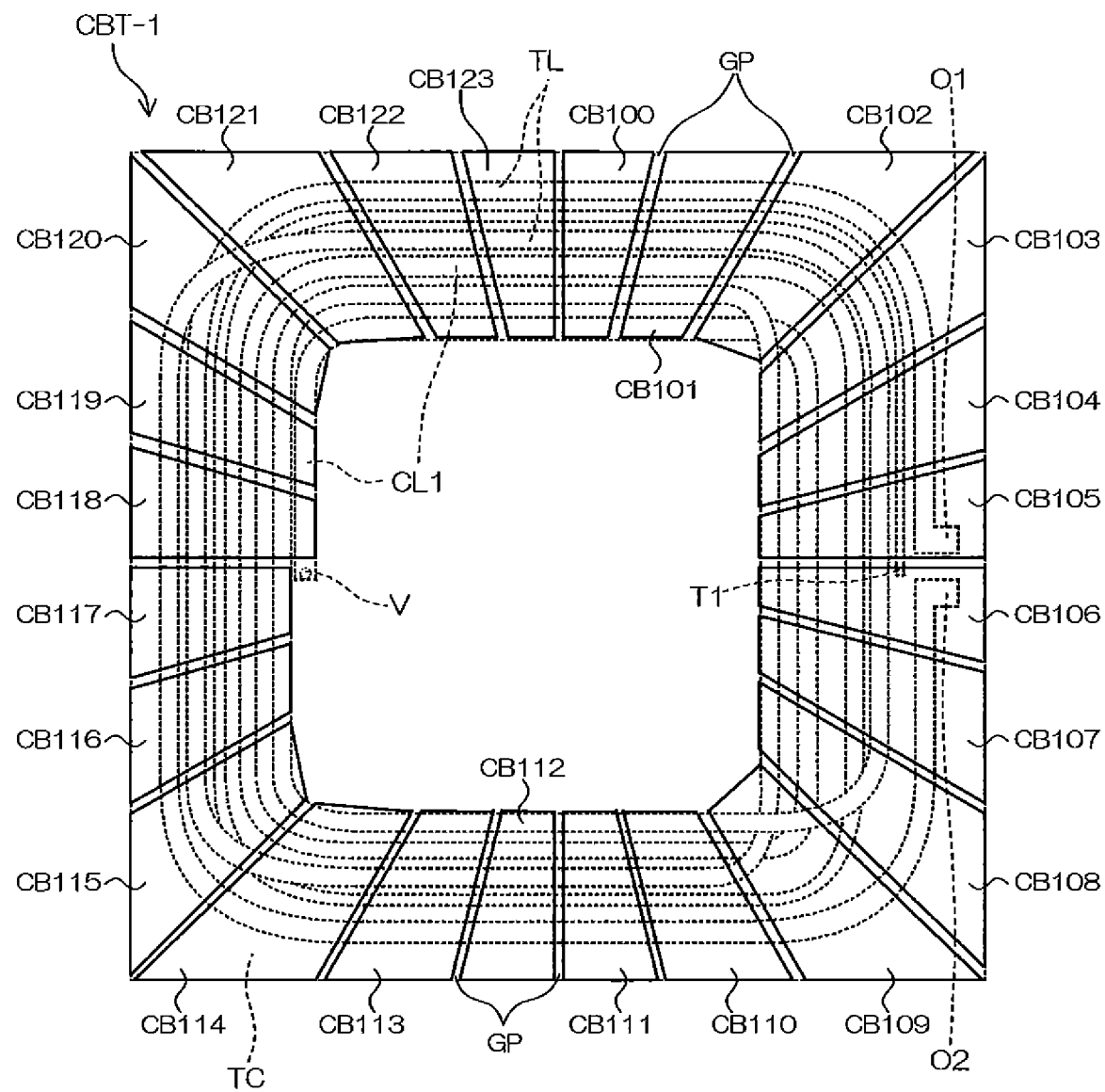
FIG. 8 is a plan view illustrating a structure of a heat release plate of a first modification embodiment.

As illustrated in the plan view of FIG. 8, a heat release plate CBT-1 of the first modification embodiment is formed as an aggregation of 24 heat release member CB100 to heat release member CB123 divided by the gaps GP that are radially formed with the center of the power transmission coil TC as a center, as with the heat release plate CBT of the embodiment. Each of the heat release member CB100 to the heat release member CB123, for example, is formed of a metal plate that has excellent thermal conductivity and is in the shape of a flat plate (for example, an aluminum plate having the same thickness as that of the heat release member CB0 to the heat release member CB23 of the embodiment), and all of the heat release members are stacked on the power transmission coil TC in the same plane, by interposing the resin layer CP therebetween. On the other hand, as illustrated in FIG. 8, the shape of the outer edge of the heat release plate CBT-1 including the heat release member CB100 to the heat release member CB123 together is approximately similar to the shape of the outer edge of the power transmission coil TC. Further, the shape of the inner edge of the heat release plate CBT-1 is a shape along the inner edge of the innermost circumference portion of the power transmission coil TC including the power transmission loop coil TL and the coil CL1. Then, the length of each of the heat release member CB100 to the heat release member CB123 in the radial direction of the power transmission coil TC is different from that of the heat release plate CBT of the embodiment, and is approximately 1.1 times the width to which the width of the copper thin film wire configuring the power transmission loop coil TL and the entire width of one side in the winding of the coil CL1 are added (refer to the reference numeral "W1" in FIG. 3). That is, the position of the outer edge of the heat release plate CBT-1 described above is slightly outside the position of the outer edge of the power transmission coil TC when seen from the center of the power transmission coil TC. Note that, the reason that the gap GP in the heat release plate CBT-1 is radially formed as described above is the same as that of the heat release plate CBT of the embodiment.

(ii) Second Modification Embodiment

Next, a second modification embodiment will be described by using FIG. 9. Note that, FIG. 9 is a plan view illustrating the structure of a heat release plate of the second modification embodiment, and is a plan view when the heat release plate of the second modification embodiment is seen from a power transmission unit side of the second modification embodiment in a power transmission apparatus of the second modification embodiment.

Figure 9:
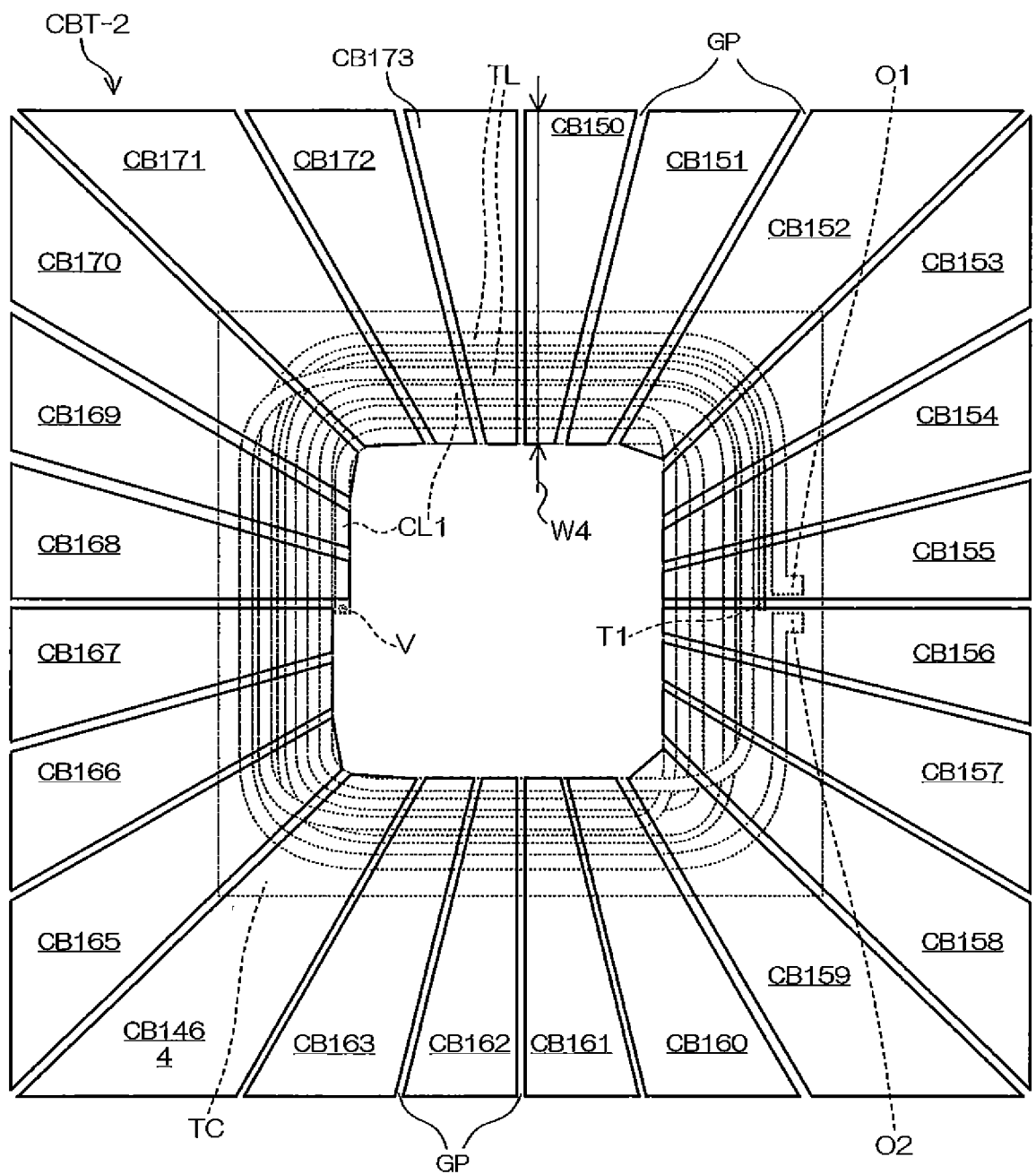
FIG. 9 is a plan view illustrating a structure of a heat release plate of a second modification embodiment.

As illustrated in the plan view of FIG. 9, a heat release plate CBT-2 of the second modification embodiment is formed as an aggregation of 24 heat release member CB150 to heat release member CB173 divided by the gaps GP that are radially formed with the center of the power transmission coil TC as a center, as with the heat release plate CBT of the embodiment. Each of the heat release member CB150 to the heat release member CB173, for example, is formed of a metal plate that has excellent thermal conductivity and is in the shape of a flat plate (for example, an aluminum plate having the same thickness as that of the heat release member CB0 to the heat release member CB23 of the embodiment), and all of the heat release members are stacked on the power transmission coil TC in the same plane, by interposing the resin layer CP therebetween. On the other hand, as illustrated in FIG. 9, the shape of the outer edge of the heat release plate CBT-2 including the heat release member CB150 to the heat release member CB173 together is approximately similar to the shape of the outer edge of the power transmission coil TC. Further, the shape of the inner edge of the heat release plate CBT-2 is a shape along the inner edge of the innermost circumference portion of the power transmission coil TC including the power transmission loop coil TL and the coil CL1. Then, the length of each of the heat release member CB150 to the heat release member CB173 in the radial direction of the power transmission coil TC (refer to a reference numeral "W4" in FIG. 9) is different from that of the heat release plate CBT of the embodiment, and is approximately three times the width to which the width of the copper thin film wire configuring the power transmission loop coil TL and the entire width of one side in the winding of the coil CL1 are added (refer to the reference numeral "W1" in FIG. 3). For this reason, the position of the outer edge of the heat release plate CBT-1 described above is outside the position of the outer edge of the power transmission coil TC when seen from the center of the power transmission coil TC. Note that, the reason that the gap GP in the heat release plate CBT-2 is radially formed as described above is the same as that of the heat release plate CBT of the embodiment.

(iii) Third Modification Embodiment

Next, a third modification embodiment will be described by using FIG. 10. Note that, FIG. 10 is a plan view illustrating the structure of a heat release plate of the third modification embodiment, and is a plan view when the heat release plate of the third modification embodiment is seen from a power transmission unit side of the third modification embodiment in a power transmission apparatus of the third modification embodiment.

Figure 10:
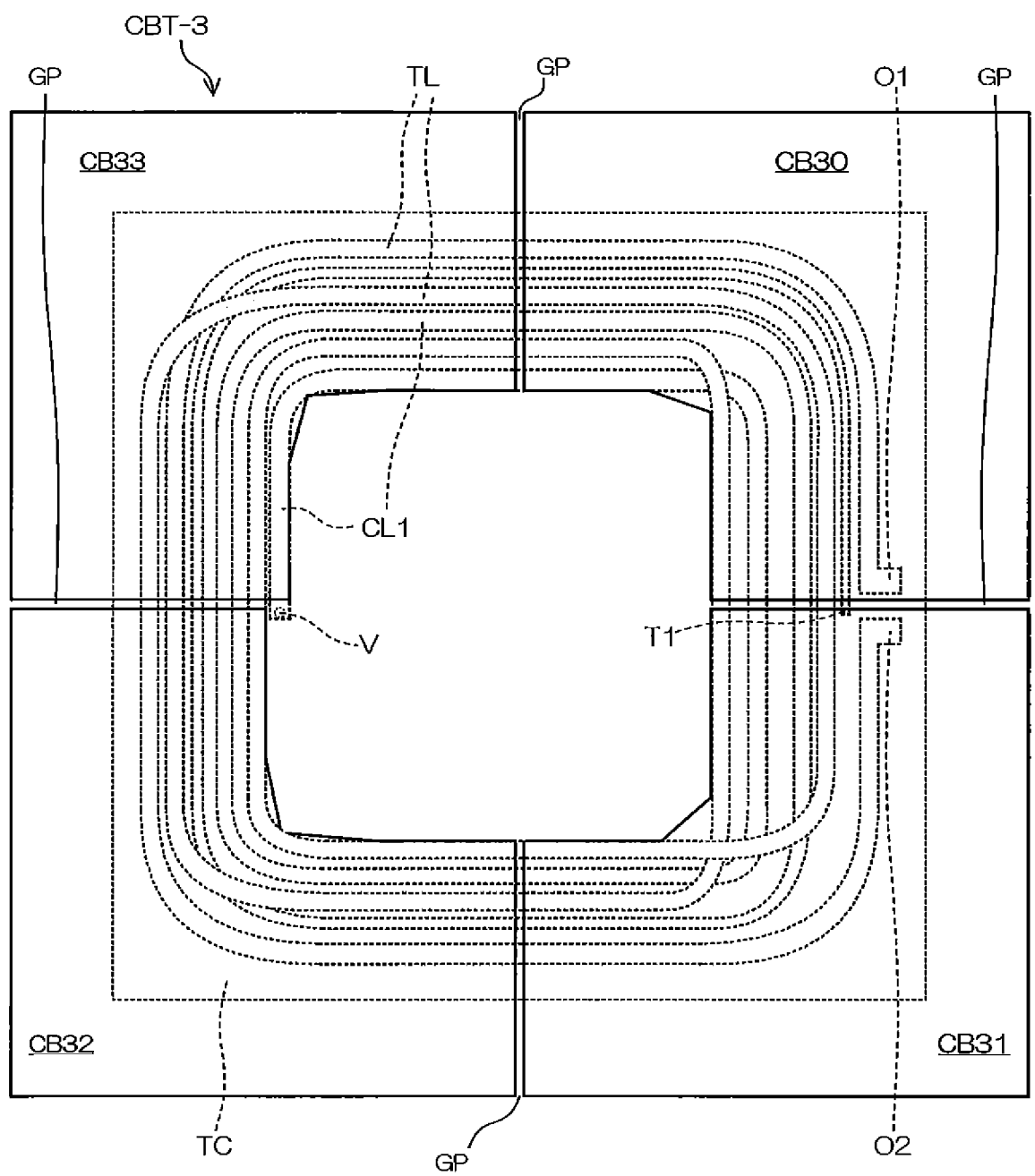
FIG. 10 is a plan view illustrating a structure of a heat release plate of a third modification embodiment.

As illustrated in the plan view of FIG. 10, a heat release plate CBT-3 of the third modification embodiment has approximately the same size as that of the heat release plate CBT of the embodiment, and is formed as an aggregation of four square heat release member CB30 to heat release member CB33 divided by linear gaps GP that are formed into the shape of a cross with the center of the power transmission coil TC as a center. At this time, the shapes of the heat release member CB30 to the heat release member CB33 are approximately identical to each other except for an inner edge portion corresponding to the innermost circumference of the power transmission coil TC. In addition, each of the heat release member CB30 to the heat release member CB33, for example, is formed of a metal plate that has excellent thermal conductivity and is in the shape of a flat plate (for example, an aluminum plate having the same thickness as that of the heat release member CB0 to the heat release member CB23 of the embodiment), and all of the heat release members are stacked on the power transmission coil TC in the same plane, by interposing the resin layer CP therebetween. On the other hand, as illustrated in FIG. 10, the shape of the outer edge of the heat release plate CBT-3 including the heat release member CB30 to the heat release member CB33 together is approximately shape similar to the shape of the outer edge of the power transmission coil TC. Then, the length of the side forming the gap GP in each of the heat release member CB30 to the heat release member CB33 is longer than the length of one side of the power transmission coil TC. For this reason, the position of the outer edge of the heat release plate CBT-3 described above is outside the position of the outer edge of the power transmission coil TC when seen from the center of the power transmission coil TC. Note that, the reason that the gap GP in the heat release plate CBT-3 is disposed into the shape of a cross illustrated in FIG. 10 (a radial shape) is because an eddy current in the heat release plate CBT-3 is divided by the gaps GP, and thus, the generation of the eddy current is suppressed, as with the heat release plate CBT of the embodiment.

(iv) Fourth Modification Embodiment

Next, a fourth modification embodiment will be described by using FIG. 11. Note that, FIG. 11 is a plan view illustrating the structure of a heat release plate of the fourth modification embodiment, and is a plan view when the heat release plate of the fourth modification embodiment is seen from a power transmission unit side of the fourth modification embodiment in a power transmission apparatus of the fourth modification embodiment.

Figure 11:
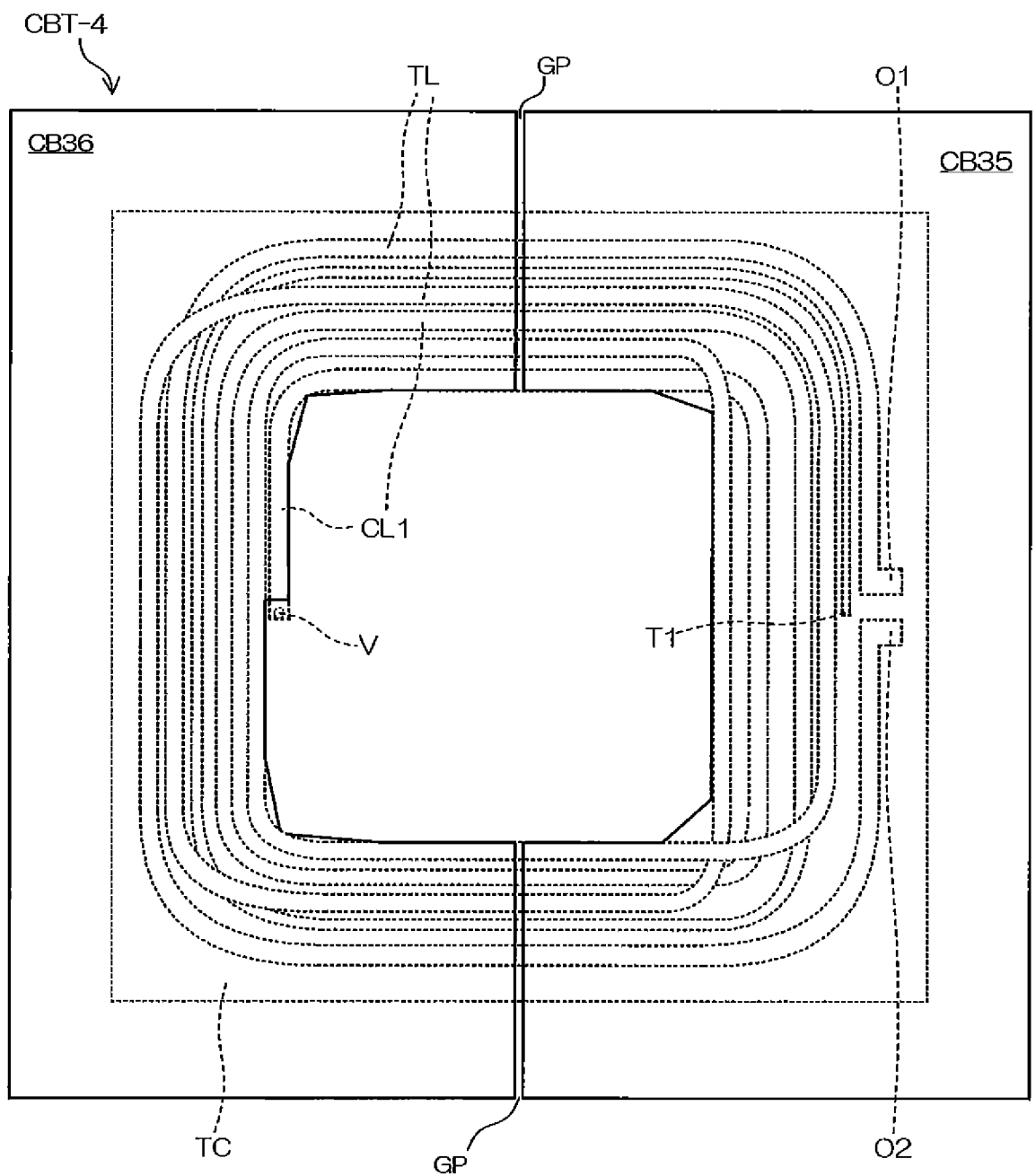
FIG. 11 is a plan view illustrating a structure of a heat release plate of a fourth modification embodiment.

As illustrated in the plan view of FIG. 11, a heat release plate CBT-4 of the fourth modification embodiment has a shape in which a set of gaps GP in facing positions (in a case exemplified in FIG. 11, a set of facing gaps GP in a horizontal direction of FIG. 11) are eliminated from the heat release plate CBT-3 of the third modification embodiment. That is, as illustrated in FIG. 11, the heat release plate CBT-4 of the fourth modification embodiment is formed as an aggregation of two square heat release member CB35 and heat release member CB36 divided by linear gaps GP that are disposed in the facing positions when seen from the center of the power transmission coil TC. At this time, the shapes of the heat release member CB35 and the heat release member CB36 are approximately identical to each other except for the inner edge portion corresponding to the innermost circumference of the power transmission coil TC. In addition, each of the heat release member CB35 and the heat release member CB36, for example, is formed of a metal plate that has excellent thermal conductivity and is in the shape of a flat plate (for example, an aluminum plate having the same thickness as that of the heat release member CB0 to the heat release member CB23 of the embodiment), and both of the heat release members are stacked on the power transmission coil TC in the same plane, by interposing the resin layer CP therebetween. On the other hand, as illustrated in FIG. 11, the shape of the outer edge of the heat release plate CBT-4 including the heat release member CB35 and the heat release member CB36 together is approximately similar to the shape of the outer edge of the power transmission coil TC. Then, the length of the side forming the gap GP in each of the heat release member CB35 and the heat release member CB36 is longer than the length of one side of the power transmission coil TC. For this reason, the position of the outer edge of the heat release plate CBT-4 described above is outside the position of the outer edge of the power transmission coil TC when seen from the center of the power transmission coil TC. Note that, the reason that the gap GP in the heat release plate CBT-4 is disposed in the position of the radial shape illustrated in FIG. 10 is because an eddy current in the heat release plate CBT-4 is divided by the gaps GP, and thus, the generation of the eddy current is suppressed, as with the heat release plate CBT of the embodiment.

(v) Fifth Modification Embodiment

Finally, a fifth modification embodiment will be described by using FIG. 12. Note that, FIG. 12 is a plan view illustrating the structure of a heat release plate of the fifth modification embodiment, and is a plan view when the heat release plate of the fifth modification embodiment is seen from a power transmission unit side of the fifth modification embodiment in a power transmission apparatus of the fifth modification embodiment.

Figure 12:
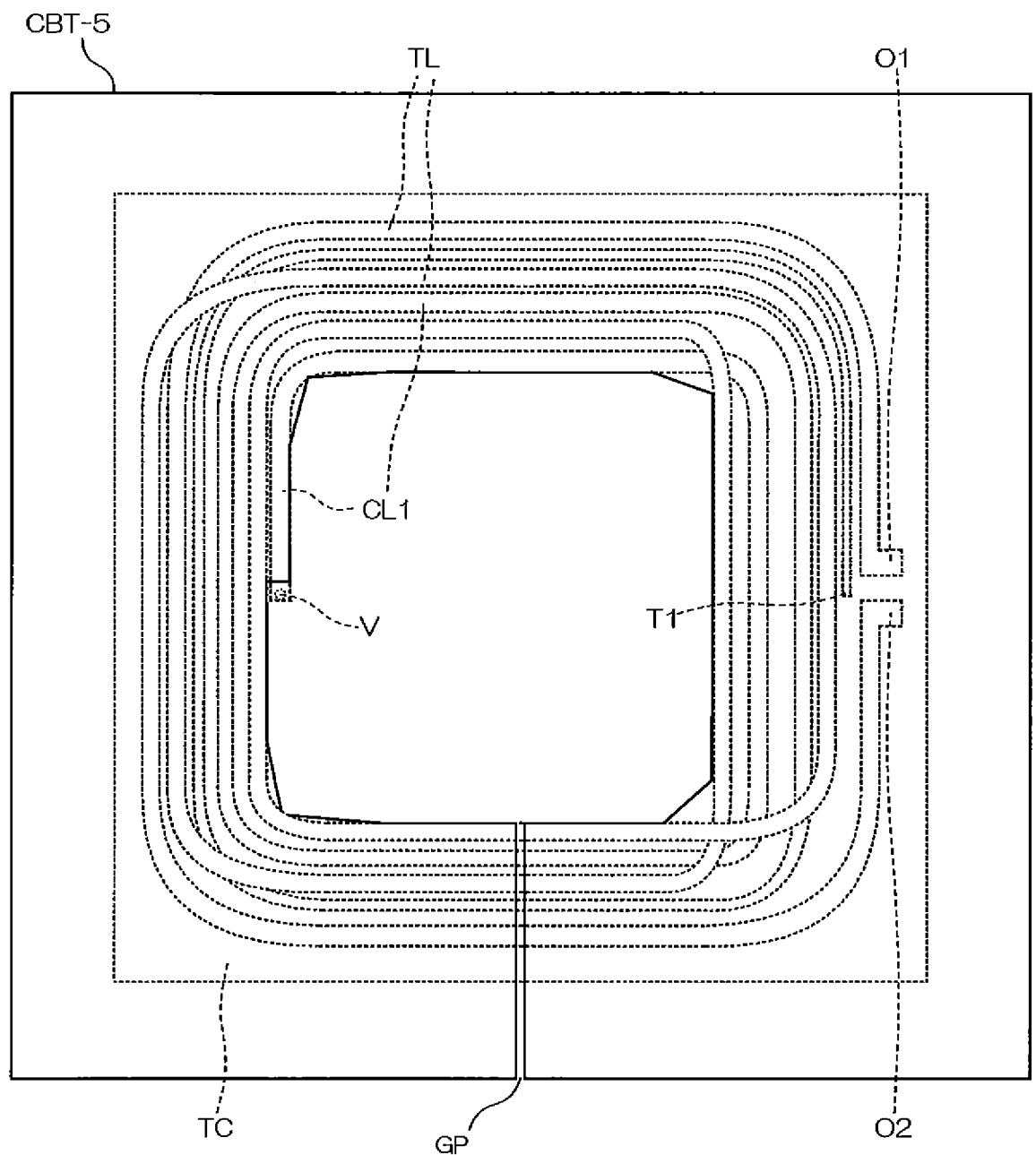
FIG. 12 is a plan view illustrating a structure of a heat release plate of a fifth modification embodiment.

As illustrated in the plan view of FIG. 12, in a heat release plate CBT-5 of the fifth modification embodiment, only one gap GP is provided, compared to the heat release plate CBT-3 of the third modification embodiment and the heat release plate CBT-4 of the fourth modification embodiment. That is, as illustrated in FIG. 12, the heat release plate CBT-5 of the fifth modification embodiment is formed as one heat release plate divided by only one linear gap GP. Then, the heat release plate CBT-5, for example, is formed of a metal plate that has excellent thermal conductivity and is in the shape of a flat plate (for example, an aluminum plate having the same thickness as that of the heat release member CB0 to the heat release member CB23 of the embodiment), and is stacked on the power transmission coil TC by interposing the resin layer CP therebetween. On the other hand, as illustrated in FIG. 12, the shape of the outer edge of the heat release plate CBT-5 is approximately similar to the shape of the outer edge of the power transmission coil TC. Then, the length of the side forming the gap GP in the heat release plate CBT-5 is longer than the length of one side of the power transmission coil TC. For this reason, the position of the outer edge of the heat release plate CBT-5 described above is outside the position of the outer edge of the power transmission coil TC when seen from the center of the power transmission coil TC. Note that, the reason that the gap GP is disposed in the heat release plate CBT-5 is because an eddy current in the heat release plate CBT-5 is divided by the gap GP, and thus, the generation of the eddy current is suppressed, as with the heat release plate CBT of the embodiment.

Note that, as with the third modification embodiment to the fifth modification embodiment, for example, an effect of facilitating alignment with respect to the power transmission coil TC in the manufacturing while suppressing the generation of an overcurrent can be obtained by decreasing the number of gaps GP. On the other hand, in a case where the number of gaps GP is large, the size per one heat release member can be decreased, which can be advantageous from the viewpoint of manufacturing the heat release member itself.

EXAMPLES

Next, an effect relevant to a reduction in a leaked magnetic field in a case where a power transfer is performed by using the power transfer system S of the embodiment including the power transmission coil TC and the power reception coil RC of the embodiment described above will be described as a first example by using FIG. 13, on the basis of a simulation result of the present inventors. In addition, an effect or the like relevant to a transfer efficiency in a case where a power transfer is performed by using the power transfer system S or the like of the embodiment and each of the modification embodiments including the power transmission coil TC or the like and the power reception coil RC or the like of the embodiment and each of the modification embodiments described above will be described as a second example by using the following table and FIG. 14, on the basis of the simulation result described above. Further, a heat release effect in the case of using the heat release plate CBT and the heat release plate CBR of the embodiment will be described as a third example.

(I) First Example

First, the effect relevant to a reduction in the leaked magnetic field described above will be described by using FIG. 13. Note that, FIG. 13 is a figure illustrating the state of the leaked magnetic field due to the structure of the power transfer system S of the embodiment. In addition, in FIG. 13, a solid straight line in a horizontal direction of FIG. 13 illustrates the power transmission coil TC and the power reception coil RC of the embodiment, and including the shielding plate ST and the magnetic plate MT, the shielding plate SR and the magnetic plate MR, and the heat release plate CBT and the heat release plate CBR corresponding to the power transmission coil TC and the power reception coil RC, respectively, along with the power transmission coil TC and the power reception coil RC, is illustrated by "(RC, CBR, MR, SR)" and "(TC, CBT, MT, ST)". In addition, in FIG. 13, a curve that is broadened around the power transmission coil TC and the power reception coil RC illustrates the state of the leaked magnetic field for each intensity, and the intensity is illustrated by a number (the unit is amperes/meter (A/m)) in FIG. 13. Further, in the power transfer system S in which a simulation result illustrated in FIG. 13 is obtained, a magnetic plate having a relative magnetic permeability of 1200 and a thickness of 0.1 millimeters is used as the magnetic plate MT and the magnetic plate MR described above, and one aluminum plate without having the gap GP having a thickness of 1 millimeter is used as the shielding plate ST and the shielding plate SR described above. Further, a limit value of the leaked magnetic field described in the guideline set by ICNIRP (published in 2010) as the law or the like described above is 21 amperes/meter.

Figure 13:
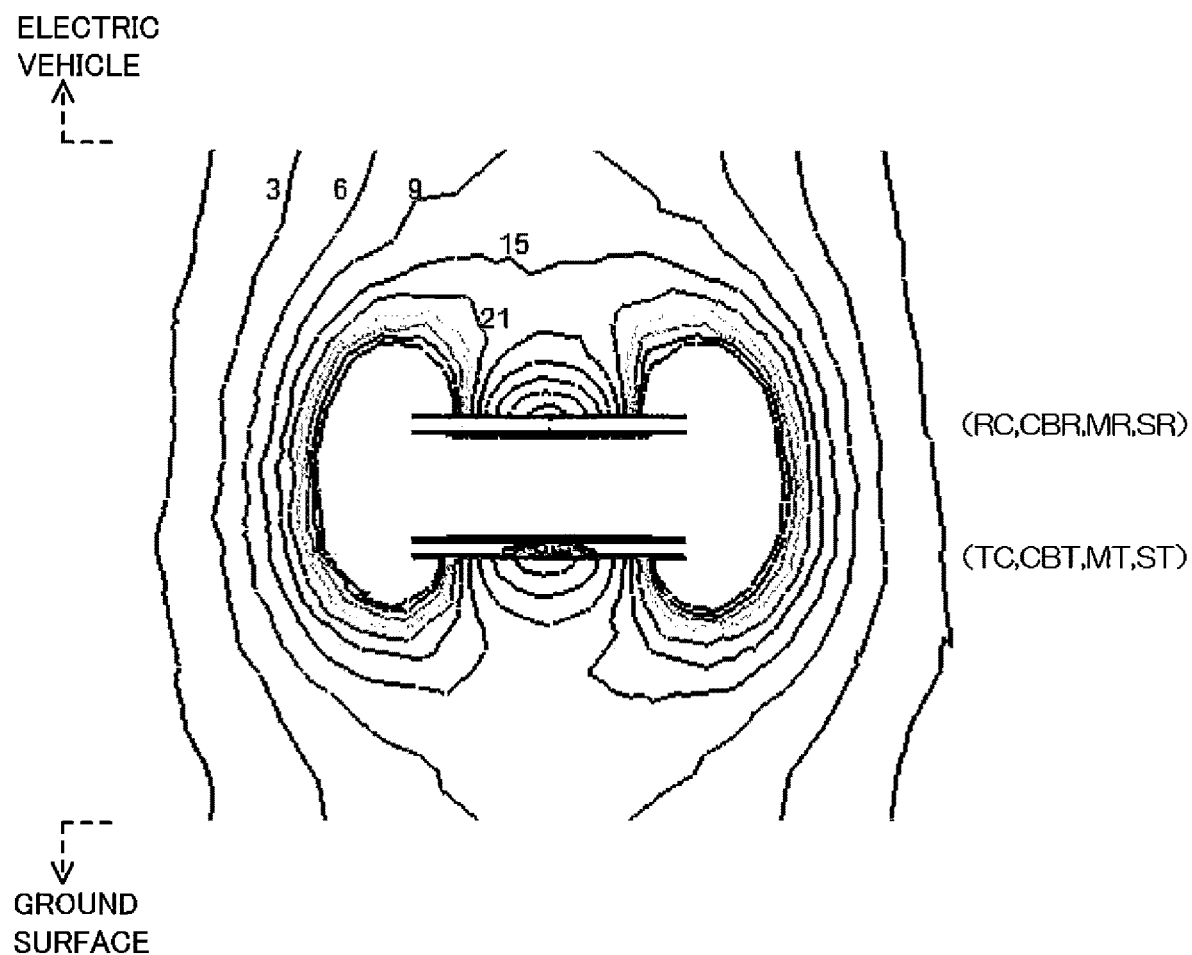
FIG. 13 is a figure illustrating a state of a leaked magnetic field due to the structure of the power transfer system of the embodiment.

As found from FIG. 13, in the case of using the power transfer system S of the embodiment, the leaked magnetic field that is generated due to a power transfer of the power transmission coil TC and the power reception coil RC is shielded by the shielding plate ST and the shielding plate SR, and the magnetic plate MT and the magnetic plate MR. Accordingly, it is considered that the safety of a passenger of the electric vehicle on which the power reception coil RC is mounted (the passenger is positioned on the upper side of FIG. 14 or is positioned outside a range illustrated on the upper side) from the leaked magnetic field of greater than or equal to the limit value described above is ensured.

(II) Second Example

Next, an effect or the like relevant to a transfer efficiency in a case where a power transfer is performed by using the power transfer system S or the like of the embodiment and each of the modification embodiments described above will be described by using FIG. 14, FIG. 15, and the following table, on the basis of the simulation result described above.

Figure 14:
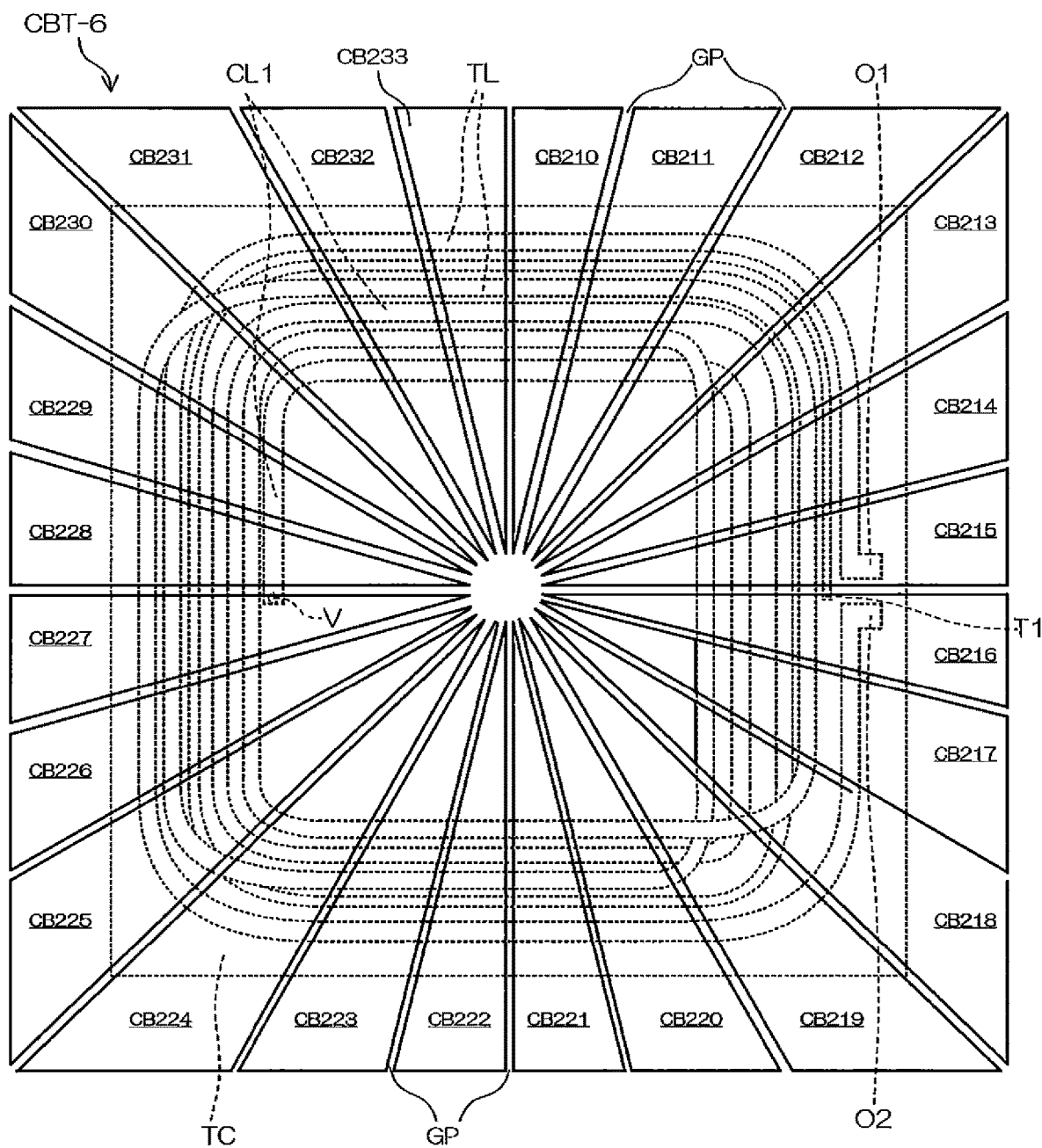
FIG. 14 is a plan view illustrating a structure of a heat release plate of a first comparative example.

Note that, FIG. 14 is a plan view illustrating the structure of a heat release plate of a first comparative example described below, and is a plan view when the heat release plate of the first comparative example is viewed from a power transmission unit side of the first comparative example in a power transmission apparatus of the first comparative example. Further, in FIG. 14, a power transmission loop coil or the like of a power transmission coil of the first comparative example on which the heat release plate of the first comparative example is stacked is illustrated by a broken line. At this time, the configuration of the power transmission coil and a resin layer of the first comparative example is identical to the configuration of the power transmission coil TC and the resin layer CP of the embodiment, and thus, in FIG. 14, the same reference numerals will be applied to the same configuration members as those of the power transmission coil TC of the embodiment, and the detailed description thereof will be omitted. In addition, the following table is a table showing a resonance frequency, the value of an S parameter S11 representing a reflection rate, the value of an S parameter S21 representing a transfer efficiency, and the value of the transfer efficiency based on the S parameter S11 and the S parameter S21 in the case of using each of the heat release plates of the embodiment and each of the modification embodiments described above, along with each of the values in the case of using heat release plates of each of the comparative examples described below, for example. Further, each of the drawings in FIG. is a plan view illustrating a generation status of an eddy current or the like in the heat release plate CBT or the like of the embodiment, each of the modification embodiments, and the like, with respect to the heat release plate CBT or the like that is stacked on the power transmission coil TC, and the description of the power transmission coil TC itself other than the heat release plate will be omitted.

TABLE 1

| Shape and others of heat release plate | Resonance frequency (MHz) | S parameter (S11, dB) | S parameter (S21, dB) | Transfer efficiency (%) |
|---|---|---|---|---|
| Embodiment | 3.4 | −27.8 | −0.7 | 85.4 |
| First modification embodiment | | −18.0 | −0.9 | 83.3 |
| Second modification embodiment | 2.65 | −29.88 | −0.839 | 82.5 |
| Third modification embodiment | 2.65 | −28.673 | −0.537 | 88.5 |
| Fourth modification embodiment | 2.70 | −24.469 | −0.591 | 87.6 |
| Fifth modification embodiment | 2.60 | −28.609 | −0.569 | 87.8 |
| First comparative example | 2.7 | −27.529 | −1.391 | 72.7 |
| Second comparative example | 3.4 | −15.6 | −1.1 | 80.0 |

TABLE 1-continued

| Shape and others of heat release plate | Resonance frequency (MHz) | S parameter (S11, dB) | S parameter (S21, dB) | Transfer efficiency (%) |
| --- | --- | --- | --- | --- |
| Third comparative example | 7.0 | −7.8 | −17.3 | 2.3 |

First, the heat release plate of the first comparative example will be described by using FIG. 14. As illustrated in each of the plan views of FIG. 14, a heat release plate CBT-6 of the first comparative example is formed as an aggregation of 24 heat release member CB210 to heat release member CB233 divided by the gaps GP that are radially formed with the center of the power transmission coil TC as a center, as with the heat release plate CBT of the embodiment. Each of the heat release member CB210 to the heat release member CB233, for example, is formed of a metal plate that has excellent thermal conductivity and is in the shape of a flat plate (for example, an aluminum plate having the same thickness as that of the heat release member CB0 to the heat release member CB23 of the embodiment), and all of the heat release members are stacked on the power transmission coil TC in the same plane, by interposing the resin layer CP therebetween. On the other hand, as illustrated in FIG. 14, the shape of the outer edge of the heat release plate CBT-6 including the heat release member CB210 to the heat release member CB233 together is approximately similar to the shape of the outer edge of the power transmission coil TC. Further, the shape of the inner edge of the heat release plate CBT-6 is different from that of the heat release plate CBT of the embodiment, and each of the heat release plate CB210 to the heat release plate CB233 is formed to extend to the vicinity of the center of the heat release plate CBT-6. Accordingly, the length of each of the heat release member CB210 to the heat release member CB233 in the radial direction of the power transmission coil TC is different from that of the heat release plate CBT of the embodiment, and is approximately three times the width to which the width of the copper thin film wire configuring the power transmission loop coil TL and the entire width of one side in the winding of the coil CL1 are added (refer to the reference numeral "W1" in FIG. 3), and the position of the outer edge of the heat release plate CBT-6 described above is outside the position of the outer edge of the of the power transmission coil TC when seen from the center of the power transmission coil TC. Note that, the reason that the gap GP in the heat release plate CBT-6 is radially formed as described above is the same as that of the heat release plate CBT of the embodiment.

Next, as a second comparative example of the table described above, a simulation result using a power transmission apparatus and a power reception apparatus in which the power transmission coil TC and the power reception coil RC of the embodiment, the shielding plate ST and the shielding plate SR of the embodiment, and the magnetic plate MT and the magnetic plate RT of the embodiment are provided, but the heat release plate CBT and the heat release plate CBR, and the resin layer CP of the embodiment are not provided is illustrated.

Further, as a third comparative example of the table described above, a simulation result using a power transmission apparatus and a power reception apparatus in which one aluminum plate having the same thickness of 1 millimeter is provided as a heat release plate instead of the heat release plate CBT and the heat release plate CBR of the embodiment is illustrated.

Then, as found from the table described above, in the case of using the heat release plate CBT or the like of the embodiment and each of the modification embodiments, and the first comparative example and the second comparative example, the resonance frequency is suppressed to a low level as expected, and the transfer efficiency has an excellent value of greater than or equal to that of the second comparative example in which the heat release plate CBT described above or the like is not used. At this time, the transfer efficiency is most excellent in the case of using the heat release plate CBT or the like of the embodiment and each of the modification embodiments in which the heat release member CB0 and the like are divided by the gaps GP having a radial shape and the heat release member is not provided in each central portion thereof. In contrast, in the third comparative example using the heat release plate without having the gap GP, the resonance frequency is extremely transitioned (increases), and the transfer efficiency also considerably decreases. It is considered that this is because there is no gap GP, and thus, the transfer efficiency decreases due to the interference of the electromagnetic wave that is caused by the fact that the heat release plate itself becomes the radiation source of the electromagnetic wave due to the eddy current described above generated in the heat release plate. Here, regarding a change in the transfer efficiency described above, the result of a simulation with respect to the generation status of the eddy current described above that is performed by the present inventors is illustrated in FIG. 15. Note that, in each of FIG. 15(a) to FIG. 15(e), the state of the eddy current (the induction current) that is generated in the heat release plate CBT or the like by a current flowing through the power transmission coil TC is illustrated by large and small arrows.

Figure 15A:
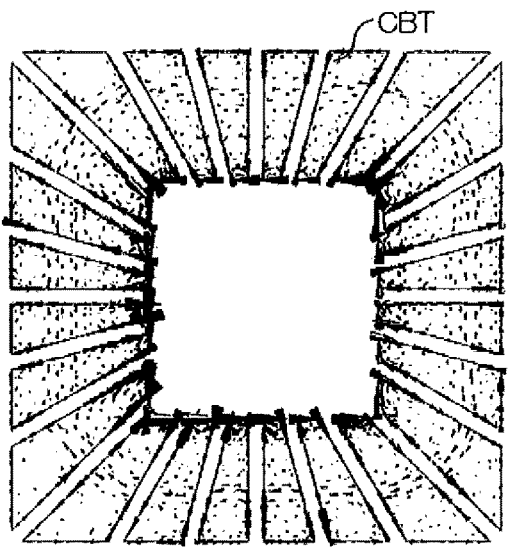
FIG. 15 is a figure illustrating a generation status of an eddy current or the like in the heat release plate of the embodiment, each of the modification embodiments, and the like, in which (a) is a figure illustrating the generation status of the eddy current or the like in the heat release plate of the embodiment, (b) is a figure illustrating the generation status of the eddy current or the like in the heat release plate of the third modification embodiment, (c) is a figure illustrating the generation status of the eddy current or the like in the heat release plate of the fourth modification embodiment, (d) is a figure illustrating the generation status of the eddy current or the like in the heat release plate of the fifth modification embodiment, and (e) is a figure illustrating the generation status of the eddy current or the like in the heat release plate of the third comparative example.
Figure 15B:
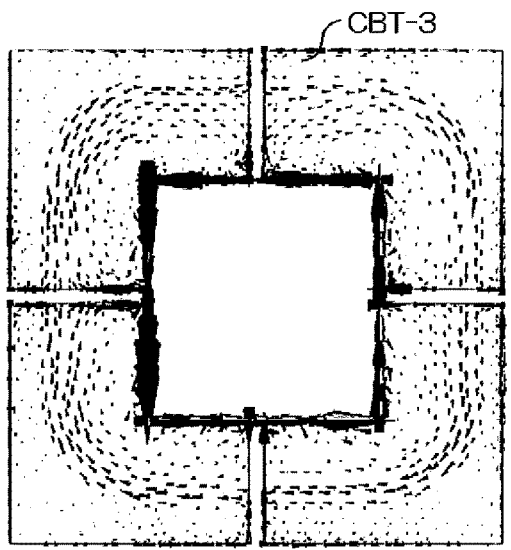
Figure 15C:
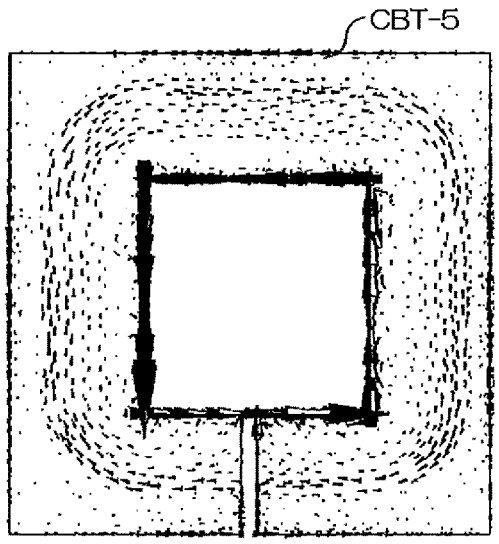
Figure 15D:
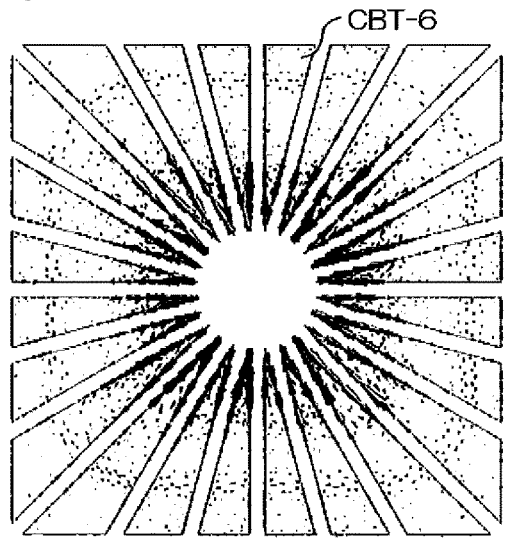
Figure 15E:
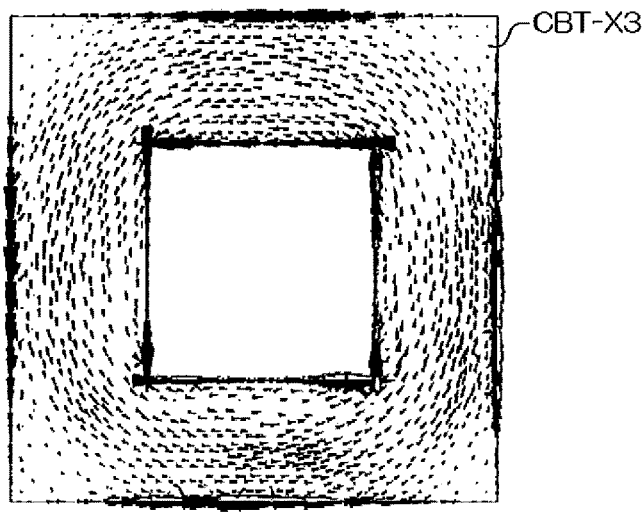

First, in each of the heat release plate CBT of the embodiment illustrated in FIG. 15(a), the heat release plate CBT-3 of the third modification embodiment illustrated in FIG. 15(b), and the heat release plate CBT-5 of the fifth modification embodiment illustrated in FIG. 15(c), each looped eddy current as illustrated by minute arrows is generated along the shape of the power transmission coil TC (a loop shape) on which the heat release plate is stacked. In contrast, in each of the heat release members CB0 and the like configuring each of the heat release plate CBT and the like, as illustrated in FIG. 15(a) to FIG. 15(c), an eddy current illustrated by large arrows is divided into two groups toward the inner circumference direction and the outer circumference direction, and further flows along the edge of the heat release member CB0 and the like such that the spiral direction is different. The directions of the magnetic fields generated from the eddy current (the induction current) generated as described above are opposite to each other, and thus, the magnetic fields cancel each other out, which, as a result, does not affect a transfer efficiency as the power transmission coil TC. In contrast, in the case of a heat release plate CBT-X3 without having the gap GP that is illustrated in FIG. 15(e) as the heat release plate CBT-X3 of the third comparative example, the looped eddy current flows through the heat release plate CBT-X3 in one direction (in FIG. 15(e), a counterclockwise direction, including the edge portion), and thus, the directions of all of the magnetic fields generated from such an eddy current are the same, which, as a result, affects the transfer efficiency of the power transmission coil TC. On the other hand, even in the case of the heat release plate CBT-6 of the first comparative example illustrated in FIG. 15(d), the eddy currents flowing in opposite directions are generated, as with the heat release plate CBT or the like of the embodiment. However, in the case of the heat release plate CBT-6 of the first comparative example, the amount of eddy current flowing to a portion protruding to the center portion of the power transmission coil TC is greater than that of the eddy current flowing to the outer circumference portion of the heat release plate CBT-6 (that is, the eddy current is biased to the center portion of the power transmission coil TC), which affects the transfer efficiency as the power transmission coil TC, as with the case of the heat release plate CBT-X3 that is not divided.

Note that, the simulation result shown in the table described above is applied to the power reception coil RC, and it is not necessary that the power transmission coil TC provided on the ground surface is provided with the shielding layer ST or the heat release plate CBT having conductivity, and there is no person or the like nearby who is affected by the leaked magnetic field, and thus, it can be said that the magnetic plate MT and the shielding plate ST, and the heat release plate CBT are not required for the power transmission coil TC. However, as found from the contents of the table described above, the magnetic plate MT and the magnetic plate MR, and the heat release plate CBT are provided and effectively function, and thus, it is found that there is an effect of lowering the resonance frequency and of improving the transfer efficiency while effectively cooling the power transmission coil TC and the power reception coil RC. Then, in particular, according to the effect of lowering the frequency described above, in a case where the resonance frequency as the power transmission coil TC or the power reception coil RC is adjusted, the length of the copper thin film wire itself of each of the coil CL1 and the like can be decreased, power loss or heat generation due to electric resistance of the copper thin film wire can be further suppressed. For this reason, as with the power reception coil RC, it is desirable that the power transmission coil TC is also provided with the shielding plate ST and the magnetic plate MT, and the heat release plate CBT.

(III) Third Example

Finally, an example of the heat release effect of the heat release plate CBT (or the heat release plate CBR) and the resin layer CP of the embodiment described above will be described by the comparison with the case of not using the heat release plate CBT (or the heat release plate CBR) and/or the resin layer CP.

Note that, the heat release effect as the third example was checked by using the thermal conductive sheet formed of the non-silicone-based acrylic sheet described above, and as a specification thereof, by using the resin layer CP having a thickness of approximately 1 millimeter, a thermal conductance rate of approximately 5 watts/meter·kelvin, and a volume resistivity of approximately $1.0 \times 10^{11}$ ohms·centimeter, as the resin layer CP of the third example, and by using square aluminum having a thickness of 1 millimeter and a size in which one side is 350 millimeters (a thermal conductance rate of 236 watts/meter·kelvin), as the heat release plate CBT (or the heat release plate CBR) of the third example. Note that, at this time, the specification of the power transmission open coil TC (or the power reception coil RC) of the third example is as follows.

Size and Others: a square having one side of 300 millimeters, in which the width of a copper thin film wire portion on each side of the coil (refer to the reference numeral "W1" in FIG. 3) is 75 millimeters Number of Windings of Power Transmission Loop Coil TL: five rotations (five turns)

Number of Windings of Coil CL1: two and a half rotations (2.5 turns)

Winding of Coil CL2: 11 and a half rotations (11.5 turns)

Then, in a case where a current of 20 amperes was applied to the power transmission loop coil TL, the highest temperature of the power transmission coil TC (or the power reception coil RC) reached 70 degrees in the case of including only the power transmission coil TC (or the power reception coil RC) without including the heat release plate CBT and the resin layer CP, and the highest temperature of the power transmission coil TC (or the power reception coil RC) reached 60 degrees in the case of using only the resin layer CP without using the heat release plate CBT. In contrast, in a case where the heat release plate CBT was stacked by interposing the resin layer CP therebetween, and then, a current of 20 amperes flowed through the power transmission loop coil TL, the highest temperature of the power transmission coil TC (or the power reception coil RC) only reached 35 degrees. Accordingly, it is found that a sufficient cooling effect of the power transmission coil TC (or the power reception coil RC) can be obtained by the heat release plate CBT and the resin layer CP of the embodiment.

As described above, according to the power transfer using the power transfer system S of the embodiment including the power transmission coil TC and the power reception coil RC of the embodiment (hereinafter, the power transmission coil TC and the power reception coil RC will be collectively referred to as the "power transmission coil TC or the like"), the heat release plate CBT or the like includes the heat release member CB0 and the like that are divided by one or a plurality of gaps GP along the radial direction of the winding surface of the copper thin film wire configuring the power transmission coil TC or the like, and thus, the current due to the electromagnetic wave that is generated from the power transmission coil TC or the like by the power transfer is divided, and therefore, a transfer efficiency as the power transfer system S or the like can also be improved while effectively cooling the power transmission coil TC or the like from heat that is generated by the flow of the current.

In addition, the thermally conductive resin layer CP is interposed between the power transmission coil TC or the like and the heat release plate CBT (and the heat release plate CBR), and thus, the adhesiveness between the power transmission coil TC or the like and the heat release plate CBT (and the heat release plate CBR) can be increased, and the power transmission coil TC or the like can be efficiently cooled while avoiding the risk of discharge from the power transmission coil TC or the like.

Further, the power transmission coil TC or the like includes the coil CL1 or the like in which the copper thin film wire is wound a plurality of times, the gap GP of the heat release plate CBT or the like is a plurality of linear gaps GP that are radially formed along the radial direction of the winding surface, in the plane of the heat release plate CBT or the like parallel to the winding surface of the copper thin film wire configuring the coil CL1 or the like, and a plurality of heat release member CB0 and the like are divided by each of the gaps GP in the heat release plate CBT or the like, and thus, the power transmission coil TC or the like can be efficiently cooled.

Further, in the case of the embodiment and each of the modification embodiments, each of the heat release member CB0 and the like are formed in a range facing the region of the coil CL1 or the like excluding the inside region from the position of the copper thin film wire wound around the innermost circumference of the power transmission coil TC or the like, and thus, the power transmission coil TC can be effectively cooled by suppressing the generation of the current in the heat release plate CBT or the like due to the electromagnetic wave that is generated in the inside region.

In addition, each of the heat release member CB0 and the like is formed in a range facing the coil CL1 or the like in which the copper thin film wire is wound and a range facing the outside region from the position of the copper thin film wire wound around the outermost circumference of the power transmission coil TC or the like, and thus, the power transmission coil TC or the like can be efficiently cooled by increasing the size as the heat release plate CBT or the like.

Further, the shielding plate SR disposed between the power transmission coil TC or the like and the heat release plate CBT or the like, and a protection target such as a passenger, and the magnetic plate MR disposed between the power transmission coil TC or the like and the heat release plate CBT or the like, and the shielding plate SR are further provided, and the area of the shielding plate SR and the magnetic plate MR in the plane perpendicular to a straight line toward the protection target from the position of the power transmission coil TC or the like is greater than the area of the power transmission coil TC or the like in the plane, and thus, the transfer efficiency as the power transfer system S or the like can be improved while effectively cooling the power transmission coil TC or the like, and further the protection target can be effectively protected from the electromagnetic wave that is generated from the power transmission coil TC or the like.

In addition, the power transmission coil TC or the like includes the coil CL1 or the like, the area of the surface perpendicular to a perpendicular line of the shielding plate SR and the magnetic plate MR that are in the shape of a plate, in which the perpendicular line is erected in a direction toward the protection target with the center of the coil CL1 or the like as a foot, is greater than the area of the winding surface of the copper thin film wire in the coil CL1 or the like, and thus, the transfer efficiency as the power transfer system S or the like can be improved while cooling the power transmission coil TC or the like, and the protection target can be effectively protected from the electromagnetic wave that is generated by the power transfer.

Further, the power transmission coil TC or the like includes the power transmission loop coil TL (or the power reception loop coil RL) and the power transmission open coil TO (or the power reception open coil RO), and thus, the transfer efficiency can be improved while cooling the power transmission coil TC or the like, and the protection target can be effectively protected from the electromagnetic wave.

Further, the power transmission open coil TO (or the power reception open coil RO) has serial connection in which the coil CL1 and the coil CL2 are connected in the innermost circumference portion, and in the power transmission open coil TO (or the power reception open coil RO), the coil CL1 overlaps with the coil CL2 by interposing the film BF therebetween such that the winding center of the coil CL1 and the winding center of the coil CL2 are coincident with each other, and thus, the transfer efficiency can be improved while cooling the power transmission coil TC or the like and reducing the resonance frequency, and the protection target can be effectively protected from the electromagnetic wave.

In addition, in the power transmission loop coil TL (or the power reception loop coil RL), the copper thin film wire is concentrically wound with respect to the power transmission open coil TO (or the power reception open coil RO) a plurality of times, and thus, the transfer efficiency of the power can be further improved.

(IV) Other Embodiments

Next, other embodiments of the present invention will be described.

The configuration of the power transfer system S or the like of the embodiment and each of the modification embodiments described above may be modified as described in (A) to (J) described below. The present inventors have checked that the same effect as that of the power transfer system S or the like described above can be obtained even in the case of adding each of the modifications described below.

Figure 16:
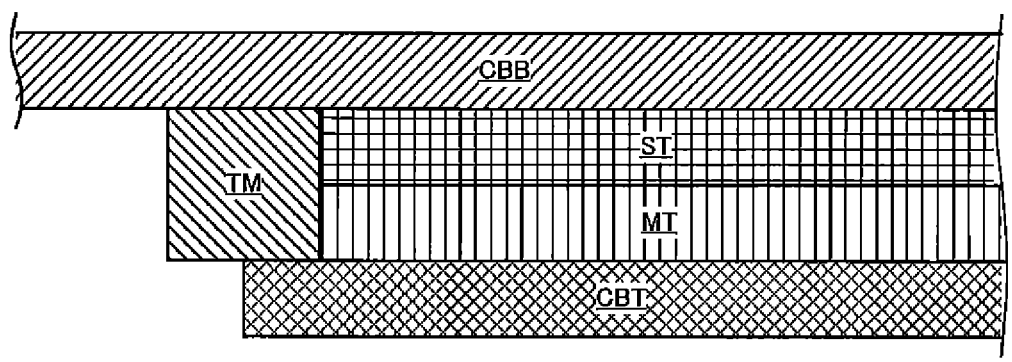
FIG. 16 is a sectional conceptual figure illustrating a configuration of a heat release plate or the like in other embodiments.

(A) The heat release plate CBT or the like of the embodiment and each of the modification embodiments, for example, may be thermally connected to the other heat release member such as a metal plate CBB (for example, may be a metal body of a vehicle or the like in a case where a heat release plate CBR is stacked on the power reception coil RC) through a thermal connection member TM, on each outer edge, as illustrated in a sectional conceptual figure of FIG. 16. At this time, it is necessary that the metal plate CBB and the heat release plate CBT or the like are electrically insulated from each other. In such a configuration, the size as the heat release member of the heat release plate CBT or the like substantially increases, and thus, the cooling effect thereof is further improved. At this time, the other heat release member corresponds to an example of a "second heat release means" of the present invention. Note that, the metallic shielding plate ST (or the shielding plate SR) may function as the other heat release member described above.

(B) In the power transmission loop coil TL or the power reception loop coil RL of the embodiment and each of the modification embodiments, the number of windings of each of the power transmission loop coil TL and the power reception loop coil RL is three rotations (three turns), but the number of windings may be greater than or equal to two rotations (two turns) or four rotations (four turns), or may be only one rotation (one turn).

(C) In the power transmission open coil TO (or the power reception open coil RO) of the embodiment and each of the modification embodiments, the number of windings of each of the coil CL1 and the coil CL2 that configure the power transmission open coil TO and the power reception open coil RO, respectively, is two and a half rotations (2.5 turns) and ten and a half rotations (10.5 turns), but the number of windings may be a different value, or the number of winding of the coil CL1 may be identical to the number of windings of the coil CL2.

(D) In the power transmission open coil TO (or the power reception open coil RO) of the embodiment and each of the modification embodiments, the power transmission loop coil TL (or the power reception loop coil RL) and the coil CL1 are formed in the same layer, but the power transmission loop coil TL (or the power reception loop coil RL) and the coil CL1 may be formed in different layers, and may be concentrically stacked.

(E) The coil CL1 and the coil CL2 of the embodiment and each of the modification embodiments are connected through the via V in each of the innermost circumference portions, but the coil CL1 and the coil CL2 may be insulated from each other.

(F) The order of the coil CL1 and the coil CL2 of the embodiment and each of the modification embodiments when seen from the side of the power transmission loop coil TL (or the power reception loop coil RL) may be switched.

(G) The position of the power transmission loop coil TL and the position of the power transmission open coil TO in the power transmission coil TC of the embodiment may be switched, and the position of the power reception loop coil RL and the position of the power reception open coil RO in the power reception coil RC of the embodiment may be switched. In this case, as the entire power transfer system, the power transmission loop coil TL of the power transmission coil and the power reception loop coil RL of the power reception coil may be disposed to face each other.

(H) In the coil CL1 of the embodiment and each of the modification embodiments, the width increases toward the inner circumference from the outer circumference, but the width of the coil CL1 may be the same over the entire circumference.

(I) In the embodiment and each of the modification embodiments, capacitors may be further connected to the end portion of the power transmission open coil TO or the power reception open coil TO that is the open end in series or in parallel or to the power transmission loop coil TL or the power reception loop coil RL in parallel, respectively, and parasitic capacity as the power transmission loop coil TO or the power reception loop coil RO, or the power transmission open coil TL or the power reception open coil RL may be adjusted, and thus, the resonance frequency may decrease. At this time, in the case of connecting the capacitor to any one of the open ends of the power transmission open coil TO or the power reception open coil RO in series, the terminal of the capacitor that is not connected to any one of the open ends may be the open end.

(J) In the embodiment and each of the modification embodiments, the gap GP is in the shape of a straight line with a constant width, but the gap GP, for example, may be in the shape of a curve, and the width thereof may not be constant (for example, a gap in which the inner width is narrow, and the outer width is wide).

INDUSTRIAL APPLICABILITY

As described above, the present invention can be used in the field of a non-contact power transfer, and in particular, in a case where the present invention is applied to the field of a power transfer for charging a storage battery mounted on an electric vehicle, a particularly remarkable effect can be obtained.

EXPLANATION OF REFERENCE NUMERALS

S POWER TRANSFER SYSTEM
T POWER TRANSMISSION APPARATUS
R POWER RECEPTION APPARATUS
V VIA
BF FILM
TR POWER TRANSMISSION UNIT
RV POWER RECEPTION UNIT
TC POWER TRANSMISSION COIL
RC POWER RECEPTION COIL
MR, MT MAGNETIC PLATE
SR, ST SHIELDING PLATE
CP RESIN LAYER
CBR, CBT, CBT-1, CBT-2, CBT-3, CBT-4, CBT-5, CBT-6, CBT-X3 HEAT RELEASE PLATE
TL POWER TRANSMISSION LOOP COIL
TO POWER TRANSMISSION OPEN COIL
RL POWER RECEPTION LOOP COIL
RO POWER RECEPTION OPEN COIL
O1, O2 CONNECTION TERMINAL
T1, T2 OPEN END
CL1, CL2 COIL
CB0, CB1, CB2, CB3, CB4, CB5, CB6, CB7, CB8, CB9, CB10, CB11, CB12, CB13, CB14, CB15, CB16, CB17, CB18, CB19, CB20, CB21, CB22, CB23, CB30, CB31, CB32, CB33, CB35, CB36, CB100, CB101, CB102, CB103, CB104, CB105, CB106, CB107, CB108, CB109, CB110, CB111, CB112, CB113, CB114, CB115, CB116, CB117, CB118, CB119, CB120, CB121, CB122, CB123, CB150, CB151, CB152, CB153, CB154, CB155, CB156, CB157, CB158, CB159, CB160, CB161, CB162, CB163, CB164, CB165, CB166, CB167, CB168, CB169, CB170, CB171, CB172, CB173, CB210, CB211, CB212, CB213, CB214, CB215, CB216, CB217, CB218, CB219, CB220, CB221, CB222, CB223, CB224, CB225, CB226, CB227, CB228, CB229, CB230, CB231, CB232, CB233 HEAT RELEASE MEMBER
GP GAP
CBB METAL PLATE
TM THERMAL CONNECTION MEMBER

The invention claimed is:
1. A power transfer apparatus, comprising:
coil assembly in which a winding wire is wound a plurality of times, the coil being configured to perform a non-contact type power transfer, the coil assembly including:
  a first coil configured to perform power transmission or power reception, as the non-contact type power transfer, the first coil including:
    an out-in winding wire wound toward an inner circumference side from an outer circumference side of the first coil; and
    an in-out winding wire that is wound in a winding direction opposite to the out-in winding wire toward the outer circumference side from the inner circumference side of the first coil, the out-in winding wire and the in-out winding wire being stacked such that a winding position of the out-in winding wire is coincident with a winding position of the in-out winding wire; and
  a second coil stacked on the first coil in which power to be subjected to the power transmission is supplied at a time of the power transmission, and power to be subjected to the power reception is output at a time of the power reception;
a heat release assembly configured to cool the coil assembly and facing a region of the coil assembly excluding a region inside from an innermost circumference of the winding wire and facing a region outside from an outermost circumference of the winding wire, in a plane parallel to a winding surface of the winding wire, the heat release assembly including:
  a plurality of metallic heat release members; and
  at least one gap that divides the plurality of metallic heat release members along a radial direction of the winding surface;
a shield that is disposed on a side opposite to a power transmission side of the coil assembly at the time of power transmission or a side opposite to a power reception side of the coil assembly at the time of power reception when seen from a position of the coil assembly and the plurality of heat release assembly, and configured to shield an electromagnetic wave generated by the power transfer; and
a magnetic body disposed between the shield and the heat release assembly.

2. The power transfer apparatus according to claim 1, further comprising:
a thermally conductive resin layer between the coil assembly and the heat release assembly.

3. The power transfer apparatus according to claim 1, wherein an area of the shield and the magnetic body in a plane perpendicular to a straight line toward the shield and the magnetic body from the position of the coil assembly is greater than or equal to an area of the coil assembly in the plane.

4. The power transfer apparatus according to claim 3, wherein the straight line is a perpendicular line that is erected in a direction toward the shield and the magnetic body with a center of the coil assembly as a foot, and
an area of a surface perpendicular to the perpendicular line of the shield and the magnetic body that are respectively in the shape of a plate is greater than or equal to an area of the winding surface of the winding wire in the coil assembly.

5. The power transfer apparatus according to claim 1, wherein in the second coil, a winding wire is wound a plurality of times.

6. The power transfer apparatus according to claim 1, further comprising:
a second heat release member that is thermally connected to and is electrically insulated from any one of the heat release members, on an outer edge of the heat release member.

7. A power transmission apparatus provided in a power transfer system that includes the power transmission apparatus and a power reception apparatus separated from the power transmission apparatus, and transfers power to the power reception apparatus from the power transmission apparatus in a non-contact manner, the power transmission apparatus comprising:
the power transfer apparatus according to claim 1; and
an output configured to output power to be transferred to the coil assembly of the power transfer apparatus.

8. A power reception apparatus provided in a power transfer system that includes a power transmission apparatus and the power reception apparatus separated from the power transmission apparatus, and transfers power to the power reception apparatus from the power transmission apparatus in a non-contact manner, the power reception apparatus comprising:
the power transfer apparatus according to claim 1; and
an input connected to the coil assembly of the power transfer apparatus.

9. A non-contact type power transfer system, comprising:
the power transmission apparatus according to claim 7; and
a power reception apparatus that is separated from the power transmission apparatus, disposed to face the coil assembly, and configured to receive power transmitted from the power transmission apparatus.

10. A non-contact type power transfer system, comprising:
a power transmission apparatus; and
the power reception apparatus according to claim 8 that is separated from the power transmission apparatus and configured to receive power transmitted from the power transmission apparatus in which the coil assembly is disposed to face the power transmission apparatus.

* * * * *